(12) United States Patent
Sarode Vishwanath

(10) Patent No.: US 11,201,037 B2
(45) Date of Patent: *Dec. 14, 2021

(54) PROCESS KIT WITH ADJUSTABLE TUNING RING FOR EDGE UNIFORMITY CONTROL

(71) Applicant: Applied Materials, Inc., Santa Clara, CA (US)

(72) Inventor: Yogananda Sarode Vishwanath, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/131,893

(22) Filed: Sep. 14, 2018

(65) Prior Publication Data

US 2019/0363003 A1 Nov. 28, 2019

(30) Foreign Application Priority Data

May 28, 2018 (IN) .............................. 201841019829

(51) Int. Cl.
*H01J 37/32* (2006.01)
*H01L 21/3065* (2006.01)
(Continued)

(52) U.S. Cl.
CPC ...... *H01J 37/32642* (2013.01); *H01J 37/321* (2013.01); *H01J 37/32091* (2013.01);
(Continued)

(58) Field of Classification Search
None
See application file for complete search history.

(56) References Cited

U.S. PATENT DOCUMENTS 5,267,607 A   12/1993  Wada
5,660,673 A    8/1997  Miyoshi
(Continued)

FOREIGN PATENT DOCUMENTS

CN    105336561 A    2/2016
CN    105789010 A    7/2016
(Continued)

OTHER PUBLICATIONS

Chinese Office Action for Application No. 201821554985.2 dated Feb. 19, 2019.
(Continued)

*Primary Examiner* — Karla A Moore
*Assistant Examiner* — Tiffany Z Nuckols
(74) *Attorney, Agent, or Firm* — Patterson + Sheridan, LLP

(57) ABSTRACT

Process kits, processing chambers, and methods for processing a substrate are provided. The process kit includes an edge ring, an adjustable tuning ring, and an actuating mechanism. The edge ring has a first ring component interfaced with a second ring component that is movable relative to the first ring component forming a gap therebetween. A lower surface of the second ring component contains an upper alignment coupling and an upper surface of the adjustable tuning ring contains a lower alignment coupling. The lower alignment coupling of the adjustable tuning ring is configured to mate with the upper alignment coupling of the second ring component to form an interface. The actuating mechanism is interfaced with the lower surface of the adjustable tuning ring. The actuating mechanism is configured to actuate the adjustable tuning ring such that the gap between the first ring component and the second ring component is varied.

20 Claims, 16 Drawing Sheets

(51) Int. Cl.
*H01L 21/687* (2006.01)
*H01L 21/683* (2006.01)

(52) U.S. Cl.
CPC .. *H01J 37/32522* (2013.01); *H01J 37/32724* (2013.01); *H01L 21/3065* (2013.01); *H01L 21/6833* (2013.01); *H01L 21/68735* (2013.01); *H01L 21/68742* (2013.01); *H01L 21/68764* (2013.01); *H01L 21/68785* (2013.01); *H01J 37/32513* (2013.01); *H01J 2237/002* (2013.01); *H01J 2237/2001* (2013.01); *H01J 2237/334* (2013.01); *H01J 2237/3343* (2013.01)

(56) References Cited

U.S. PATENT DOCUMENTS

| | | |
|---|---|---|
| 5,730,801 A | 3/1998 | Tepman et al. |
| 5,762,714 A | 6/1998 | Mohn et al. |
| 5,851,140 A | 12/1998 | Barns et al. |
| 5,885,428 A * | 3/1999 | Kogan .............. H01L 21/6833 204/298.15 |
| 6,022,809 A | 2/2000 | Fan |
| 6,044,534 A | 4/2000 | Seo et al. |
| 6,206,976 B1 | 3/2001 | Crevasse et al. |
| 6,375,748 B1 | 4/2002 | Yudovsky et al. |
| 6,391,787 B1 | 5/2002 | Dhindsa et al. |
| 6,511,543 B1 * | 1/2003 | Stauss ............... H01L 21/68721 118/500 |
| 6,521,292 B1 * | 2/2003 | Yudovsky ............. C23C 16/455 118/500 |
| 6,589,352 B1 | 7/2003 | Yudovsky et al. |
| 6,676,759 B1 | 1/2004 | Takagi |
| 6,709,547 B1 | 3/2004 | Ni et al. |
| 6,744,212 B2 | 6/2004 | Fischer et al. |
| 6,773,562 B1 | 8/2004 | Inagawa et al. |
| 6,896,765 B2 | 5/2005 | Steger |
| 6,898,558 B2 | 5/2005 | Klekotka |
| 7,138,014 B2 | 11/2006 | Stevens et al. |
| 7,138,067 B2 | 11/2006 | Vahedi et al. |
| 7,176,403 B2 | 2/2007 | Steger |
| 7,252,738 B2 | 8/2007 | Tong et al. |
| 7,311,784 B2 | 12/2007 | Fink |
| 7,338,578 B2 | 3/2008 | Huang et al. |
| 7,589,950 B2 | 9/2009 | Parkhe et al. |
| 7,824,146 B2 | 11/2010 | Lanee et al. |
| 7,968,469 B2 | 6/2011 | Collins et al. |
| 8,270,141 B2 | 9/2012 | Willwerth et al. |
| 8,298,371 B2 | 10/2012 | Koshimizu et al. |
| 8,441,640 B2 | 5/2013 | Patalay et al. |
| 8,696,878 B2 | 4/2014 | Riker et al. |
| 8,900,398 B2 | 12/2014 | Dhindsa et al. |
| 8,933,628 B2 | 1/2015 | Banna et al. |
| 8,988,848 B2 | 3/2015 | Todorow et al. |
| 8,999,106 B2 | 4/2015 | Liu et al. |
| 9,011,637 B2 | 4/2015 | Yamamoto |
| 9,017,526 B2 | 4/2015 | Singh et al. |
| 9,076,636 B2 | 7/2015 | Ohata et al. |
| 9,142,391 B2 | 9/2015 | Yamamoto |
| 9,287,093 B2 | 3/2016 | Singh et al. |
| 9,410,249 B2 | 8/2016 | Male et al. |
| 9,583,357 B1 | 2/2017 | Long et al. |
| 9,601,319 B1 | 3/2017 | Bravo et al. |
| 9,620,376 B2 | 4/2017 | Kamp et al. |
| 9,761,459 B2 | 9/2017 | Long et al. |
| 9,852,889 B1 | 12/2017 | Kellogg et al. |
| 9,881,820 B2 | 1/2018 | Wong et al. |
| 9,947,517 B1 | 4/2018 | Luere et al. |
| 10,103,010 B2 | 10/2018 | Luere et al. |
| 10,504,702 B2 | 12/2019 | Luere et al. |
| 10,553,404 B2 | 2/2020 | Luere et al. |
| 10,600,623 B2 | 3/2020 | Sarode Vishwanath |
| 10,790,123 B2 | 9/2020 | Sarode Vishwanath |
| 10,991,556 B2 | 4/2021 | Luere et al. |
| 2003/0173031 A1 | 9/2003 | Aggarwal et al. |
| 2003/0201069 A1 | 10/2003 | Johnson |
| 2004/0053428 A1 | 3/2004 | Steger |
| 2004/0149389 A1 | 8/2004 | Fink |
| 2004/0261946 A1 | 12/2004 | Endoh et al. |
| 2005/0061447 A1 | 3/2005 | Kim et al. |
| 2005/0133164 A1 | 6/2005 | Fischer et al. |
| 2005/0263070 A1 | 12/2005 | Fink |
| 2008/0066868 A1 | 3/2008 | Masuda |
| 2008/0173237 A1 * | 7/2008 | Collins ............ H01J 37/32412 118/723 I |
| 2008/0236749 A1 * | 10/2008 | Koshimizu ....... H01J 37/32091 156/345.33 |
| 2008/0289766 A1 | 11/2008 | Heemstra et al. |
| 2009/0041568 A1 | 2/2009 | Muraoka et al. |
| 2009/0067954 A1 | 3/2009 | Lanee et al. |
| 2010/0101729 A1 | 4/2010 | Kim et al. |
| 2010/0196625 A1 | 8/2010 | Yoon et al. |
| 2010/0206484 A1 | 8/2010 | Hiromi et al. |
| 2011/0031111 A1 | 2/2011 | Kobayashi |
| 2011/0157760 A1 | 6/2011 | Willwerth et al. |
| 2011/0287631 A1 | 11/2011 | Yamamoto |
| 2012/0052599 A1 | 3/2012 | Brouk et al. |
| 2012/0091108 A1 | 4/2012 | Lin et al. |
| 2012/0176692 A1 | 7/2012 | Yamawaku et al. |
| 2012/0256363 A1 | 10/2012 | Okita et al. |
| 2012/0305184 A1 | 12/2012 | Singh et al. |
| 2013/0093443 A1 | 4/2013 | Patrick |
| 2013/0106286 A1 | 5/2013 | Banna et al. |
| 2013/0155568 A1 | 6/2013 | Todorow et al. |
| 2014/0017900 A1 | 1/2014 | Doba et al. |
| 2014/0213055 A1 | 7/2014 | Himori et al. |
| 2014/0265089 A1 | 9/2014 | Tantiwong et al. |
| 2015/0064809 A1 | 3/2015 | Lubomirsky |
| 2015/0181684 A1 | 6/2015 | Banna et al. |
| 2015/0200124 A1 | 7/2015 | Yamamoto |
| 2015/0332951 A1 | 11/2015 | Male et al. |
| 2016/0042926 A1 | 2/2016 | Ishikawa et al. |
| 2016/0056017 A1 | 2/2016 | Kim et al. |
| 2016/0211165 A1 | 7/2016 | McChesney et al. |
| 2016/0211166 A1 | 7/2016 | Yan et al. |
| 2016/0240415 A1 | 8/2016 | Sekiya |
| 2017/0018411 A1 | 1/2017 | Sriraman et al. |
| 2017/0069462 A1 | 3/2017 | Kanarik et al. |
| 2017/0103870 A1 | 4/2017 | Marakhtanov et al. |
| 2017/0110335 A1 | 4/2017 | Yang et al. |
| 2017/0113355 A1 | 4/2017 | Genetti et al. |
| 2017/0115657 A1 | 4/2017 | Trussell et al. |
| 2017/0117170 A1 | 4/2017 | Wong et al. |
| 2017/0117172 A1 | 4/2017 | Genetti et al. |
| 2017/0133283 A1 | 5/2017 | Kenworthy |
| 2017/0178917 A1 | 6/2017 | Kamp et al. |
| 2017/0213758 A1 * | 7/2017 | Rice ................. H01J 37/32715 |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0250056 A1 | 8/2017 | Boswell et al. |
| 2017/0263478 A1 | 9/2017 | McChesney et al. |
| 2017/0278679 A1 | 9/2017 | Angelov et al. |
| 2017/0287682 A1 | 10/2017 | Musselman et al. |
| 2017/0287753 A1 | 10/2017 | Musselman et al. |
| 2017/0316935 A1 | 11/2017 | Tan et al. |
| 2017/0330786 A1 | 11/2017 | Genetti et al. |
| 2017/0334074 A1 | 11/2017 | Genetti et al. |
| 2017/0372912 A1 | 12/2017 | Long et al. |
| 2018/0019107 A1 | 1/2018 | Ishizawa |
| 2018/0052104 A1 | 2/2018 | Larsson et al. |
| 2018/0061696 A1 | 3/2018 | D'Ambra et al. |
| 2018/0090354 A1 | 3/2018 | Sugita et al. |
| 2018/0166259 A1 | 6/2018 | Ueda |
| 2018/0218933 A1 | 8/2018 | Luere et al. |
| 2018/0233328 A1 | 8/2018 | Ueda et al. |
| 2018/0277416 A1 * | 9/2018 | Takahashi ......... H01L 21/68735 |
| 2018/0301322 A1 | 10/2018 | Sugita et al. |
| 2018/0308737 A1 | 10/2018 | Moriya et al. |
| 2018/0315583 A1 | 11/2018 | Luere et al. |
| 2018/0315640 A1 | 11/2018 | Ueda et al. |
| 2019/0013232 A1 | 1/2019 | Yan et al. |
| 2019/0088531 A1 | 3/2019 | Sarode Vishwanath et al. |
| 2019/0172688 A1 | 6/2019 | Ueda |

(56) References Cited

U.S. PATENT DOCUMENTS

| | | |
|---|---|---|
| 2019/0172714 A1 | 6/2019 | Bobek et al. |
| 2019/0333785 A1 | 10/2019 | Tanikawa |
| 2019/0362949 A1 | 11/2019 | Sarode Vishwanath |
| 2020/0020510 A1 | 1/2020 | Shoeb et al. |
| 2020/0234981 A1 | 7/2020 | Schmid et al. |

FOREIGN PATENT DOCUMENTS

| | | |
|---|---|---|
| JP | 2000049144 A | 2/2000 |
| JP | 3020898 B2 | 3/2000 |
| JP | 2001230239 A | 8/2001 |
| JP | 2002176030 A | 6/2002 |
| JP | 2006186171 A | 7/2006 |
| JP | 2008078208 A | 4/2008 |
| JP | 2011054933 A | 3/2011 |
| JP | 2013511847 A | 4/2013 |
| JP | 2015050156 A | 3/2015 |
| KR | 20060117537 A | 11/2006 |
| KR | 100980972 B1 | 9/2010 |
| TW | 439093 B | 6/2001 |
| TW | 201243942 A | 11/2012 |
| TW | 201324674 A | 6/2013 |
| TW | 201526101 A | 7/2015 |
| TW | M587362 U | 12/2019 |
| WO | 2008005756 A2 | 1/2008 |
| WO | 2013035983 A1 | 3/2013 |

OTHER PUBLICATIONS

Taiwan Office Action dated Mar. 22, 2019 for Application No. 107217385.
"Bracelet Holder Vise Clamp Stone Prong Pave Channel Setting Setter." Prolinemax, www.prolinemax.com/BRACELET-HOLDER-VISE-Clamp-Stone-Prong-Pave-Channel-Setting-Setter-_p_1006.html.
International Search Report and Written Opinion dated Apr. 24, 2017 for Application No. PCT/US2016/069449.
Taiwan Office Action dated Sep. 20, 2019 for Application No. 106100104.
PCT Notification of Transmittal of the International Search Report and the Written Opinion of the International Searching Authority for International Application No. PCT/US2019/051771; dated Mar. 24, 2020; 11 total pages.
Japanese Office Action for Application No. JP 2019-111014 dated Aug. 25, 2020.
Office Action in related application TW108120460 dated Jan. 26, 2021.
International Search Report and Written Opinion for PCT/US2020/016242 dated Jul. 14, 2020.
Japanese Office Action dated October 27, 2020 for Application No. 2018-522911.
Non-Final Office Action dated Mar. 7, 2019 for U.S. Appl. No. 15/421,726.
Korean Office Action in related application 10-2019-0069336 dated Nov. 11, 2020.

\* cited by examiner

PROCESS KIT WITH ADJUSTABLE TUNING RING FOR EDGE UNIFORMITY CONTROL

CROSS-REFERENCE TO RELATED APPLICATION

This application claims priority to Indian Provisional Appl. No. 201841019829, filed May 28, 2018, which is incorporated herein by reference.

BACKGROUND

Field

Embodiments described herein generally relate to a substrate processing apparatus, and more specifically to an improved process kit for a substrate processing apparatus.

Description of the Related Art

As semiconductor technology nodes advanced with reduced size device geometries, substrate edge critical dimension uniformity requirements become more stringent and affect die yields. Commercial plasma reactors include multiple tunable knobs for controlling process uniformity across a substrate, such as, for example, temperature, gas flow, RF power, and the like. Typically, in etch processes, silicon substrates are etched while electrostatically clamped to an electrostatic chuck.

During processing, a substrate resting on a substrate support may undergo a process that deposits material on the substrate and to remove, or etch, portions of the material from the substrate, often in succession or in alternating processes. It is typically beneficial to have uniform deposition and etching rates across the surface of the substrate. However, process non-uniformities often exist across the surface of the substrate and may be significant at the perimeter or edge of the substrate. These non-uniformities at the perimeter may be attributable to electric field termination affects and are sometimes referred to as edge effects. During deposition or etching, process kits, as discussed and described herein, are provided to favorably influence uniformity at the substrate perimeter or edge. A plasma sheath can bend at the substrate edge depending on the edge ring geometry and therefore ions are accelerated perpendicularly to the plasma sheath. The ions can be focused or deflected at the substrate edge by the bend in the plasma sheath.

Accordingly, there is a continual need for an improved process kit for a substrate processing apparatus.

SUMMARY

Embodiments described herein generally related to a substrate processing apparatus. More specifically, process kits, processing chambers, and methods for processing a substrate are provided. In one or more embodiments, a process kit for a substrate processing chamber includes an edge ring, an adjustable tuning ring, and an actuating mechanism. The edge ring has a first ring component and a second ring component. The first ring component is interfaced with the second ring component such that the second ring component is movable relative to the first ring component forming a gap therebetween. The second ring component has an upper surface and a lower surface, such that the lower surface of the second ring component contains an upper alignment coupling. The adjustable tuning ring is positioned beneath the edge ring and has an upper surface and a lower surface. The upper surface of the adjustable tuning ring contains a lower alignment coupling. The upper surface of the adjustable tuning ring is configured to contact the lower surface of the second ring component, and the lower alignment coupling of the adjustable tuning ring is configured to mate with the upper alignment coupling of the second ring component to form an interface. The actuating mechanism is interfaced with the lower surface of the adjustable tuning ring. The actuating mechanism is configured to actuate the adjustable tuning ring such that the gap between the first ring component and the second ring component is varied.

In some examples, the upper alignment coupling is a male coupling and the lower alignment coupling is a female coupling. Alternatively, in other examples, the upper alignment coupling is the female coupling and the lower alignment coupling is the male coupling. The interface formed by the male coupling and the female coupling has a mating profile that have the geometry of dovetail, spline, finned, triangular, rectangular, square, trapezoidal, arced, or rounded.

In other embodiments, a processing chamber can include a substrate support member configured to support a substrate and the process kit supported by the substrate support member. The substrate support member can include a base, a cooling plate supported by the base, and/or an electrostatic chuck positioned on an upper surface of the cooling plate.

In some embodiments, a method for processing a substrate can include positioning the substrate on the substrate support member disposed in the processing chamber having the process kit as described above. The method further includes forming a plasma above the substrate and adjusting a height of the second ring component of the edge ring by actuating the adjustable tuning ring interfaced with the component to change a direction of ions at an edge of the substrate. A gap is disposed between the lower alignment coupling of the adjustable tuning ring and the upper alignment coupling of the second ring. The method also includes adjusting the size of the gap by moving the second ring component to vary a capacitive coupling between the adjustable tuning ring and the second ring component.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1A:
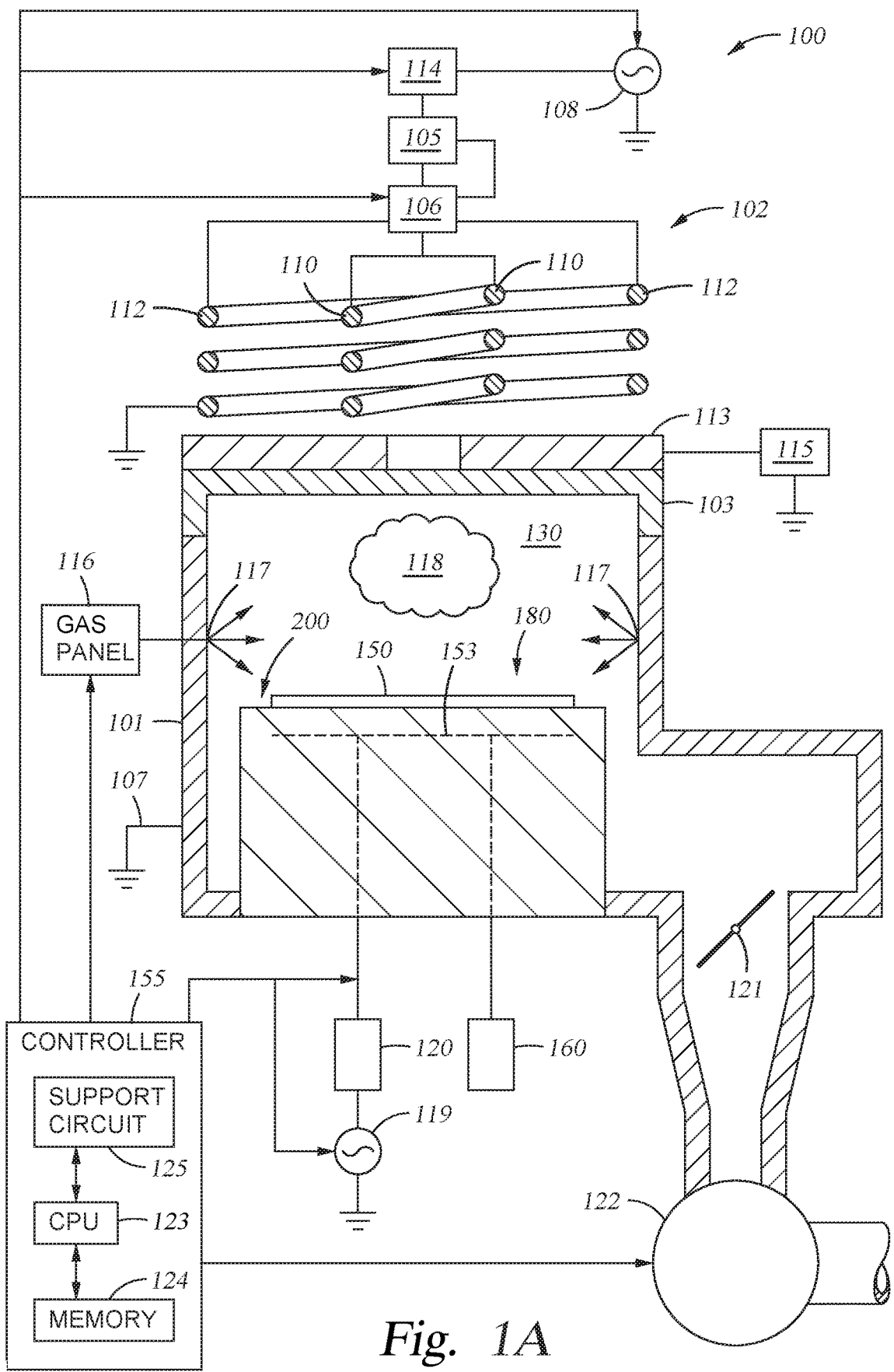
FIG. 1A depicts a cross-sectional view of a processing chamber, according to one or more embodiments.

FIG. 1A is a cross-sectional view of a processing chamber 100 having an adjustable tuning ring, according to one embodiment. As shown, the processing chamber 100 is an etch chamber suitable for etching a substrate, such as substrate 150. Examples of processing chambers that may be adapted to benefit from the disclosure are Sym3® Processing Chamber, C3® Processing Chamber, and Mesa™ Processing Chamber, commercially available from Applied Materials, Inc., located in Santa Clara, Calif. It is contemplated that other processing chamber, including deposition chambers and those from other manufacturers, may be adapted to benefit from the disclosure.

The processing chamber 100 includes a chamber body 101 and a lid 103 disposed thereon that together define an inner volume 130. The chamber body 101 is typically coupled to an electrical ground 107. A substrate support member 180 (e.g., substrate support assembly) is disposed within the interior volume 130 to support a substrate 150 thereon during processing. The processing chamber 100 also includes an inductively coupled plasma apparatus 102 for generating a plasma within the processing chamber 100, and a controller 155 adapted to control examples of the processing chamber 100.

The substrate support member 180 includes one or more electrodes 153 coupled to a bias source 119 through a matching network 120 to facilitate biasing of the substrate 150 during processing. The bias source 119 may illustratively be a source of up to about 1,000 W (but not limited to about 1,000 W) of RF energy at a frequency of, for example, approximately 13.56 MHz, although other frequencies and powers may be provided as desired for particular applications. The bias source 119 may be capable of producing either or both of continuous or pulsed power. In some examples, the bias source 119 may be a DC or pulsed DC source. In some examples, the bias source 119 may be capable of providing multiple frequencies. The one or more electrodes 153 may be coupled to a chucking power source 160 to facilitate chucking of the substrate 150 during processing.

The inductively coupled plasma apparatus 102 is disposed above the lid 103 and is configured to inductively couple RF power into the processing chamber 100 to generate a plasma within the processing chamber 100. The inductively coupled plasma apparatus 102 includes first and second coils 110, 112, disposed above the lid 103. The relative position, ratio of diameters of each coil 110, 112, and/or the number of turns in each coil 110, 112 can each be adjusted as desired to control the profile or density of the plasma being formed. Each of the first and second coils 110, 112 is coupled to an RF power supply 108 through a matching network 114 via an RF feed structure 106. The RF power supply 108 may illustratively be capable of producing up to about 4,000 W (but not limited to about 4,000 W) at a tunable frequency in a range from 50 kHz to 13.56 MHz, although other frequencies and powers may be utilized as desired for particular applications. In some examples, a power divider 105, such as a dividing capacitor, may be provided between the RF feed structure 106 and the RF power supply 108 to control the relative quantity of RF power provided to the respective first and second coils. In some examples, the power divider 105 may be incorporated into the matching network 114.

A heater element 113 may be disposed atop the lid 103 to facilitate heating the interior of the processing chamber 100. The heater element 113 may be disposed between the lid 103 and the first and second coils 110, 112. In some examples, the heater element 113 may include a resistive heating element and may be coupled to a power supply 115, such as an AC power supply, configured to provide sufficient energy to control the temperature of the heater element 113 within a desired range.

During operation, the substrate 150, such as a semiconductor wafer or other substrate suitable for plasma processing, is placed on the substrate support member 180 and process gases supplied from a gas panel 116 through entry ports 117 into the interior volume 130 of the chamber body 101. The process gases are ignited into a plasma 118 in the processing chamber 100 by applying power from the RF power supply 108 to the first and second coils 110, 112. In some examples, power from a bias source 119, such as an RF or DC source, may also be provided through a matching network 120 to electrodes 153 within the substrate support member 180. The pressure within the interior of the processing chamber 100 may be controlled using a valve 121 and a vacuum pump 122. The temperature of the chamber body 101 may be controlled using liquid-containing conduits (not shown) that run through the chamber body 101.

The processing chamber 100 may be used for various plasma processes. In one embodiment, the processing chamber 100 may be used to perform dry etching with one or more etching agents. For example, the processing chamber 100 may be used for ignition of plasma from one or more precursors or process gases, such as one or more fluorocarbons (e.g., $CF_4$ or $C_2F_6$), $O_2$, $NF_3$, $N_2$, Ar, He, or combinations thereof.

The processing chamber 100 includes a controller 155 to control the operation of the processing chamber 100 during processing. The controller 155 can include a central processing unit (CPU) 123, memory 124, and support circuits 125 for the CPU 123 and facilitates control of the components of the processing chamber 100. The controller 155 may be one of any form of general-purpose computer processor that can be used in an industrial setting for controlling various chambers and sub-processors. The memory 124 stores software (source or object code) that may be executed or invoked to control the operation of the processing chamber 100 in the manner described herein.

To facilitate control of the processing chamber 100, the CPU 123 may be one of any form of general purpose computer processor that can be used in an industrial setting, such as a programmable logic controller (PLC), for controlling various chambers and sub-processors. The memory 124 is coupled to the CPU 123 and the memory 124 is non-transitory and may be one or more of readily available memory such as random access memory (RAM), read only memory (ROM), floppy disk drive, hard disk, or any other form of digital storage, local or remote. Support circuits 125 are coupled to the CPU 123 for supporting the processor in a conventional manner. Charged species generation, heating, and other processes are generally stored in the memory 124, typically as software routine. The software routine may also be stored and/or executed by a second CPU (not shown) that is remotely located from the processing chamber 100 being controlled by the CPU 123.

The memory 124 is in the form of computer-readable storage media that contains instructions, that when executed by the CPU 123, facilitates the operation of the processing chamber 100. The instructions in the memory 124 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 1B:
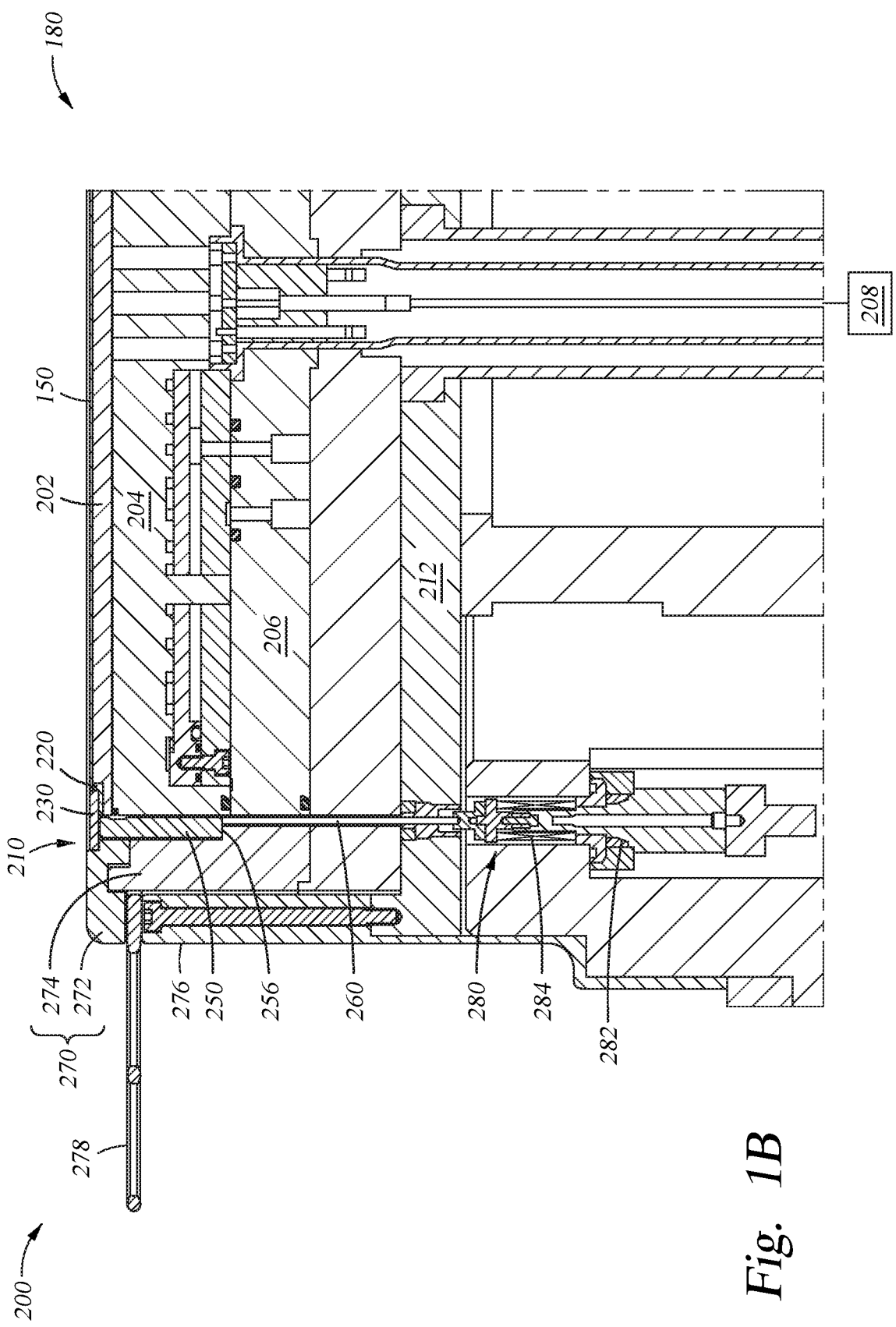
FIGS. 1B-1D depict enlarged partial cross-sectional views of a process kit contained in the processing chamber of FIG. 1A, according to one or more embodiments.
Figure 1C:
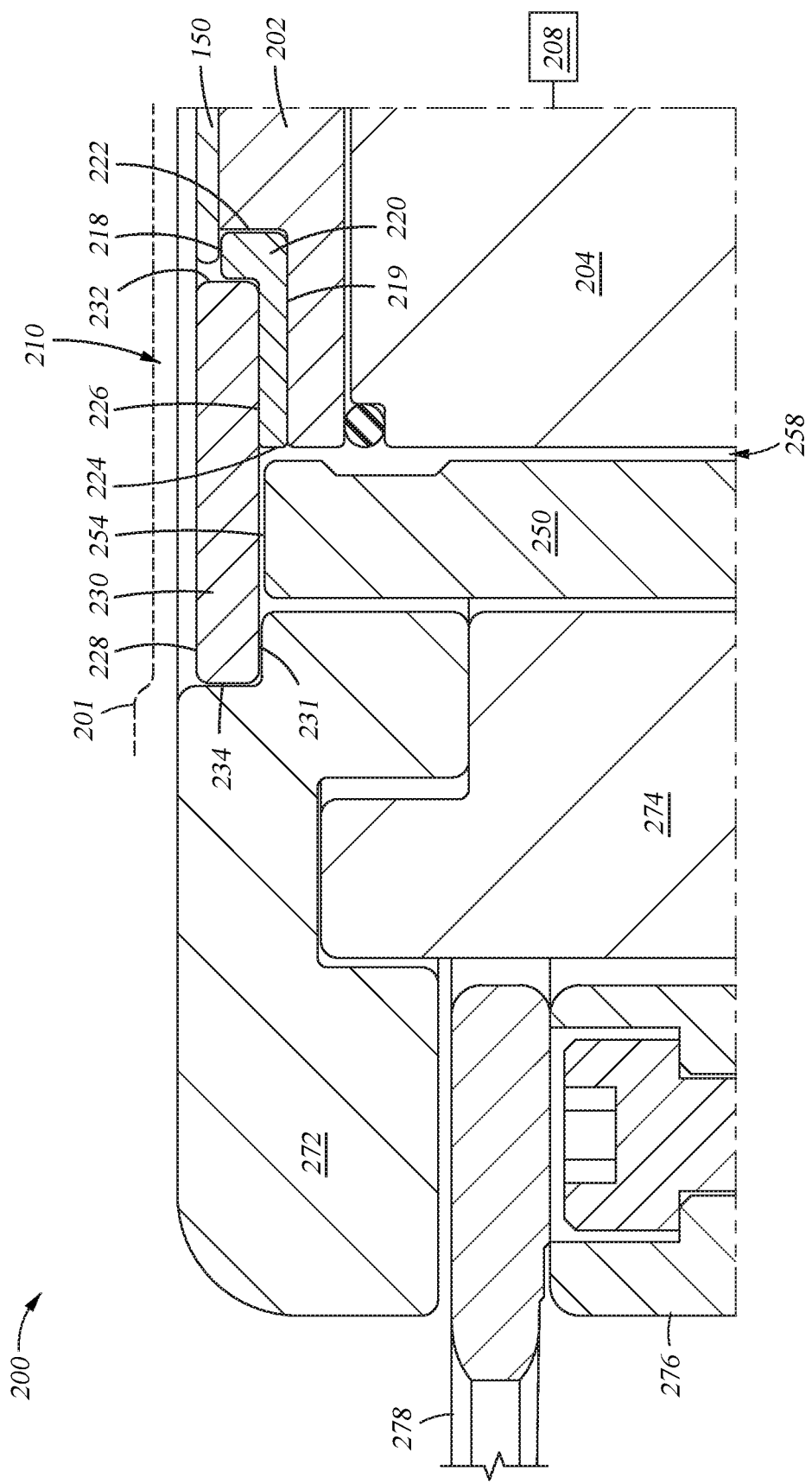

The processing chamber 100 also includes a process kit 200 disposed in the interior volume 130, such as on the substrate support member 180, as depicted in FIG. 1A. Various embodiments of the process kit 200 and other process kits are described below. The process kit 200 is used during the processing operation of the substrate 150, such as during a plasma process. FIGS. 1B and 1C depict enlarged partial cross-sectional views of the process kit 200 including the substrate support member 180 in the processing chamber 100.

The substrate support member 180 includes an electrostatic chuck (ESC) 202, a cooling plate (or cathode) 204, a base 206, and a cathode stack 212. The cooling plate 204 is disposed on the base 206. The cooling plate 204 may include a plurality of cooling channels (not shown) for circulating coolant therethrough. The cooling plate 204 may be engaged with or bonded to the electrostatic chuck 202 by an adhesive or other suitable mechanism. One or more power supplies 208 may be coupled to the cooling plate 204. The power supplies can be or include sources and/or feeds for radio frequency (RF), alternating current (AC), and/or direct current (DC). The electrostatic chuck 202 may include one or more heaters (not shown). The one or more heaters may independently be controllable. The one or more heaters enable the electrostatic chuck 202 to heat the substrate 150 to a desired temperature.

The process kit 200 includes an edge ring 210 containing a first ring component 220 and a second ring component 230 forming an annular body. The first ring component 220 and the second ring component 230 can independently be made from or include one or more electrically insulating materials, such as silicon carbide, silicon oxide, quartz, or any combination thereof. The two ring components 220, 230 are interfaced with each other such that the second ring component 230 is movable relative to the first ring component 220.

As shown in FIG. 1C, the first ring component 220 includes an upper surface 218, a lower surface 219, an inner edge 222, and an outer edge 224. The upper surface 218 is substantially parallel to the lower surface 219. The inner edge 222 is substantially parallel to the outer edge 224, and substantially perpendicular to the lower surface 219. The first ring component 220 further includes a stepped surface 226 defined therein. In the embodiment shown, the stepped surface 226 is formed in the outer edge 224, such that the stepped surface 226 is substantially parallel to the lower surface 219. The stepped surface 226 defines a recess for receiving the second ring component 230. Generally, the height of the first ring component 220 is limited by the height of the electrostatic chuck 202. For example, the inner edge 222 of the first ring component 220 does not extend above the height of the electrostatic chuck 202. As such, the first ring component 220 protects a side of the electrostatic chuck 202. In some embodiments, the substrate 150, when positioned on the electrostatic chuck 202, extends partially over the first ring component 220, such as above the upper surface 218.

The second ring component 230 includes an upper surface 228, a lower surface 231, an inner edge 232, and an outer edge 234. The upper surface 228 is substantially parallel to the lower surface 231. The inner edge 232 is substantially parallel to the outer edge 234 and substantially perpendicular to the lower surface 231. In one embodiment, the second ring component 230 is interfaced with the first ring component 220 via the lower surface 231. For example, the stepped surface 226 of the first ring component 220 interfaces with at least a portion of the lower surface 231 of the second ring component 230. When interfaced with the first ring component 220, the inner edge 232 of the second ring component 230 is spaced from the substrate 150. For example, the inner edge 232 of the second ring component 230 may be spaced between about 0.02 mm and about 0.1 mm from the substrate 150.

Figure 1D:
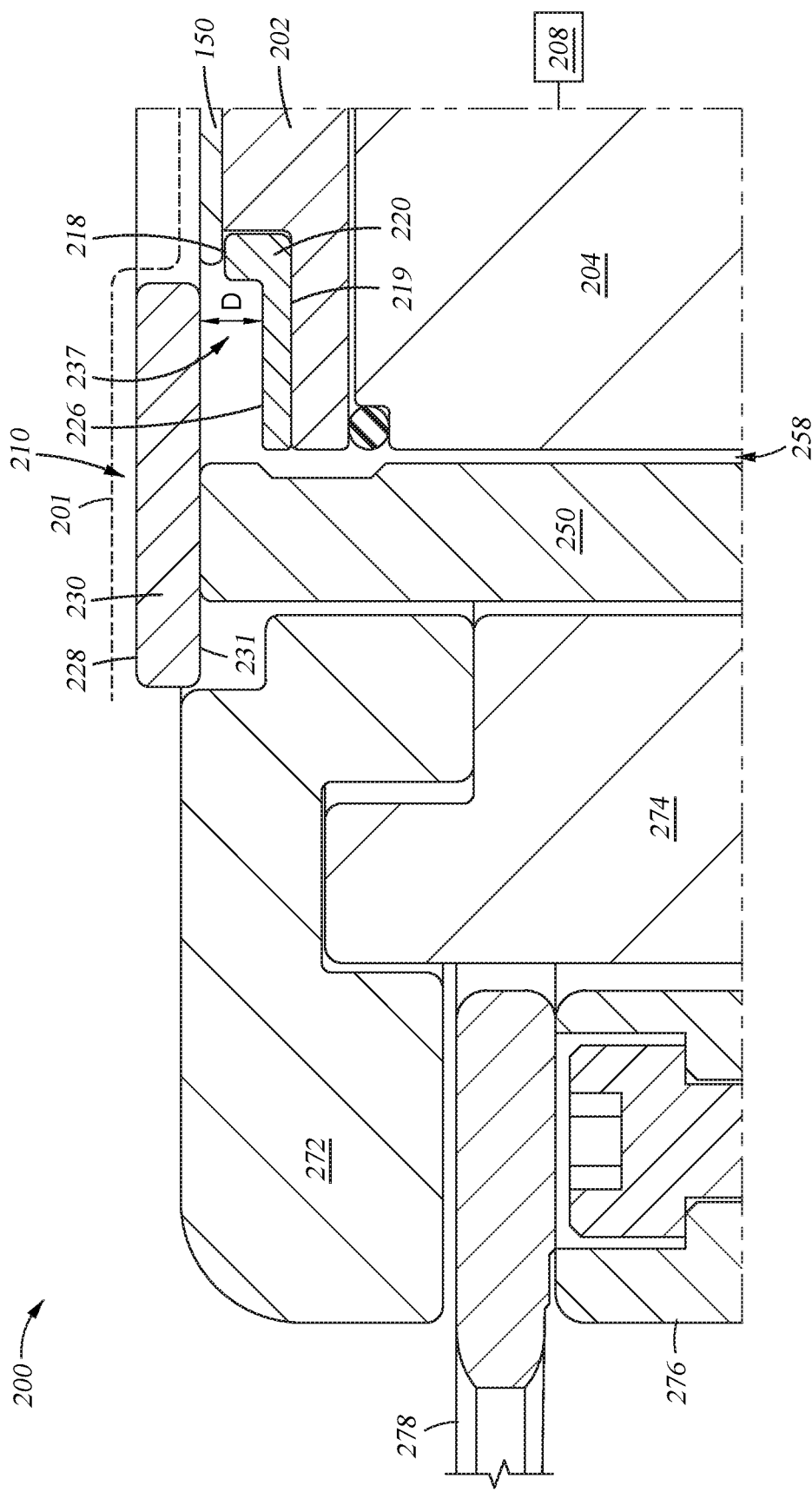

In other embodiments, when interfaced, the first ring component 220 and the second ring component 230 form a continuous lower surface and a continuous upper surface, as depicted in FIG. 1C. In another embodiment, when not interfaced, the first ring component 220 and the second ring component 230 do not form a continuous lower surface or a continuous upper surface, as depicted in FIG. 1D. Rather, in some embodiments, the upper surface 218 of the first ring component 220 may be higher than the upper surface 228 of the second ring component 230. In other embodiments, the lower surface 231 of the second ring component 230 may sit below the lower surface 219 of the first ring component 220. Thus, in some embodiments, the first ring component 220 and the second ring component 230 do not form a continuous top or lower surface.

The process kit 200 further includes an adjustable tuning ring 250 having an upper surface 254 and a lower surface 256. The adjustable tuning ring 250 may be formed from or otherwise include one or more electrically conductive materials. For example, the electrically conductive material can be or include aluminum or one or more aluminum alloys. The adjustable tuning ring 250 is disposed beneath the edge ring 210. For example, the adjustable tuning ring 250 is disposed beneath the second ring component 230. The adjustable tuning ring 250 contacts the lower surface of the 231 of the second ring component 230. In one embodiment, the adjustable tuning ring 250 extends down the length of the electrostatic chuck 202 and the cooling plate 204, such that the adjustable tuning ring 250 has a height substantially equal to the combined heights of the electrostatic chuck 202 and the cooling plate 204. As such, the adjustable tuning ring 250 is able to couple power from the cooling plate 204 to the edge ring 210.

The adjustable tuning ring 250 may circumscribe the cooling plate 204, thus forming a laterally spaced gap 258 therebetween. In one example, the laterally spaced gap 258 has a width of greater than 0 inches and less than or equal to 0.03 inches. In other examples, the laterally spaced gap 258 was a width of about 0.005 inches, about 0.007 inches, or about 0.009 inches to about 0.0010 inches, about 0.0013 inches, about 0.0015 inches, or about 0.0019 inches. For example, the laterally spaced gap 258 has a width of about 0.007 inches to about 0.0015 inches. The adjustable tuning ring 250 interfaces with a lift pin 260. For example, the lift pin 260 may be operably coupled with the adjustable tuning ring 250.

In one or more embodiments, the plasma sheath 201 at the edge of the substrate 150 can be adjusted by tuning the power coupled to the second ring component 230 by the adjustable tuning ring 250 disposed below the second ring component 230 and beside the cooling plate 204 at the laterally spaced gap 258 and further RF power is delivered to adjustable tuning ring 250 by forming capacitive coupling with cooling plate 204.

The lift pin 260 is driven by a lift or actuating mechanism 280. The actuating mechanism 280 can include one or more lift mechanisms 282, one or more sealed bellows 284, one or more actuators, one or more controllers, and other components. The lift mechanism 282 can be or include one or more servo drives, servo motors, electric motors, gears, or combinations thereof. In one or more configurations, the actuating mechanism 280 includes servo drives and actuator assemblies mounted on the outside or atmospheric side of the processing chamber 100 and connected to the actuators or lift mechanisms 282 using bellows to seal vacuum within the interior volume 130.

In one or more embodiments, the actuating mechanism 280 includes two, three, four, or more lift pins 260, each of the lift pins 260 having a first end and a second end, the first end of the lift pin 260 contacting the lower surface 256 of the adjustable tuning ring 250, and the second end of the lift pin 260 in communication with a lift mechanism 282. The actuating mechanism 280 allows the adjustable tuning ring 250 to be moved vertically within the processing chamber 100. As a result of the vertical movement of the tuning ring 250, the actuating mechanism 280 raises, lowers, or otherwise moves the second ring component 230.

As depicted in FIG. 1D, the second ring component 230 may be raised above the first ring component 220, thus forming a gap 237 between the stepped surface 226 of the first ring component 220 and the lower surface 231 of the second ring component 230. The gap 237 can be from about 0 mm, about 1 mm, about 2 mm, or about 3 mm to about 5 mm, about 7 mm, about 10 mm, or about 12 mm. The actuating mechanism 280 interfaced with the lower surface 256 of the adjustable tuning ring 250, the actuating mechanism 280 configured to actuate the adjustable tuning ring 250 such that the gap 237 between the first ring component 220 and the second ring component 230 is varied.

In one embodiment, the adjustable tuning ring 250 may include a coating formed or otherwise disposed on the upper surface 254 of the adjustable tuning ring 250. For example, the coating may be or include an yttria oxide coating or a gel-like coating. The coating is used to limit the chemical reaction between the plasma and the adjustable tuning ring 250 and thus limits particle creation and ring damage. In another embodiment, one or more dielectric pads (e.g., pads containing polytetrafluoroethylene) are positioned in between the edge ring 210 and the electrostatic chuck 202.

The process kit 200 also includes a cover ring assembly 270, an annular body 276, and a plasma screen 278 disposed therebetween. The cover ring assembly 270 has an annular shape and includes a cover ring 272 and a sleeve 274. The cover ring 272 and the sleeve 274 can independently be made from or include quartz material or other plasma resistant material. For example, the cover ring 272 can be a quartz ring and the sleeve 274 can be a quartz pipe.

In one or more embodiments, as depicted in FIGS. 1C and 1D, a plasma sheath 201 is formed over portions of the substrate 150 and the edge ring 210 within the process kit 200 in the processing chamber 100. The voltage, $V_{DC}$, can be used to control the plasma sheath 201 profile at the edge of the substrate 150 to compensate for critical dimension uniformity at the edge of the substrate 150. The plasma sheath 201 is a thin region of strong electric fields formed by space charge that joins the body of the plasma to its material boundary. Mathematically, the sheath thickness, d, is represented by the Child-Langmuir equation:

$$d = \frac{2}{3}\left(\frac{\varepsilon}{i}\right)^{\frac{1}{2}}\left(\frac{2e}{m}\right)^{\frac{1}{4}}(V_p - V_{DC})^{\frac{3}{4}},$$

where i is the ion current density, ε is the permittivity of vacuum, e is the elementary electric charge, $V_p$ is the plasma potential, and $V_{DC}$ is the DC voltage.

In the case of an etch reactor, a plasma sheath 201 is formed between the plasma and the substrate 150 being etched, the chamber body 101, and every other part of the process kit 200 and the processing chamber 100 in contact with the plasma. The ions produced in a plasma are accelerated in the plasma sheath and move perpendicular to the plasma sheath. Controlling the $V_{DC}$, i.e., controlling the voltage applied to the edge ring 210, affects the thickness, d, of the plasma sheath 201. The sheath thickness, d, of the plasma sheath 201 may be measured with respect to the edge ring 210. For example, the thickness, d, is depicted in FIGS. 1C and 1D. In the embodiment shown, actuating the adjustable tuning ring 250 raises second ring component 230. Because $V_{DC}$ remains constant, the sheath thickness above the edge ring 210 remains constant. Therefore actuating the adjustable tuning ring 250 vertically raises the plasma sheath 201 without impacting the sheath thickness. Thus, moving the adjustable tuning ring 250 affects the shape of the plasma sheath 201 at the edge of the substrate 150, which in turn controls the direction of plasma ions.

FIG. 1D illustrates the portion of the process kit 200 in the processing chamber 100 of FIG. 1C, with the second ring component 230 in the raised position. As illustrated, and as discussed in FIG. 1C, raising the adjustable tuning ring 250 raises the second ring component 230, which in turn raises the plasma sheath 201. Because the potential, $V_{DC}$, remains nearly constant as a result of a nearly fixed capacitance, the plasma sheath 201 thickness, d, remains constant throughout.

FIGS. 2A-2J depict enlarged partial cross-sectional views of process kits 200a-200j which include alignment couplings disposed between the interface of the edge ring 210 and adjustable tuning ring 250, according to one or more embodiments. Each of the process kits 200a-200j can be used in the processing chamber 100 by replacing the process kit 200, completely or in part, with any of the process kits 200a-200j.

Each of the process kits 200a-200j includes the edge ring 210 having the first ring component 220 and the second ring component 230. The first ring component 220 can be interfaced with the second ring component 230 such that the second ring component 230 is movable relative to the first ring component 220 in order to form the gap 237 therebetween (as depicted in FIG. 1D). For example, the gap 237 can be formed between the stepped 226 of the first ring component 220 and the lower surface 231 of the second ring component 230. The upper surface 254 of the adjustable tuning ring 250 and the lower surface 231 of the second ring component 230 can engage or otherwise contact each other.

The lower surface 231 of the second ring component 230 includes an upper alignment coupling 236 and the upper surface 254 of the adjustable tuning ring 250 includes a lower alignment coupling 252. The lower alignment coupling 252 of the adjustable tuning ring 250 can mate with the upper alignment coupling 236 of the second ring component 230 to form an interface having a reciprocal or mating profile.

The upper alignment coupling 236 can be a male or female coupling and the lower alignment coupling 252 is the opposite type of coupling as the upper alignment coupling 236. For example, if the upper alignment coupling 236 is a male coupling, then the lower alignment coupling 252 is a female coupling. Alternatively, if the upper alignment coupling 236 is the female coupling, then the lower alignment coupling 252 is the male coupling. The reciprocal or mating profile formed between the upper alignment coupling 236 and the lower alignment coupling 252 can have a geometry of a dovetail, a spline, finned, triangular, rectangular, square, trapezoidal, arced, rounded, combinations of such geometries, as well as other geometries.

Figure 2A:
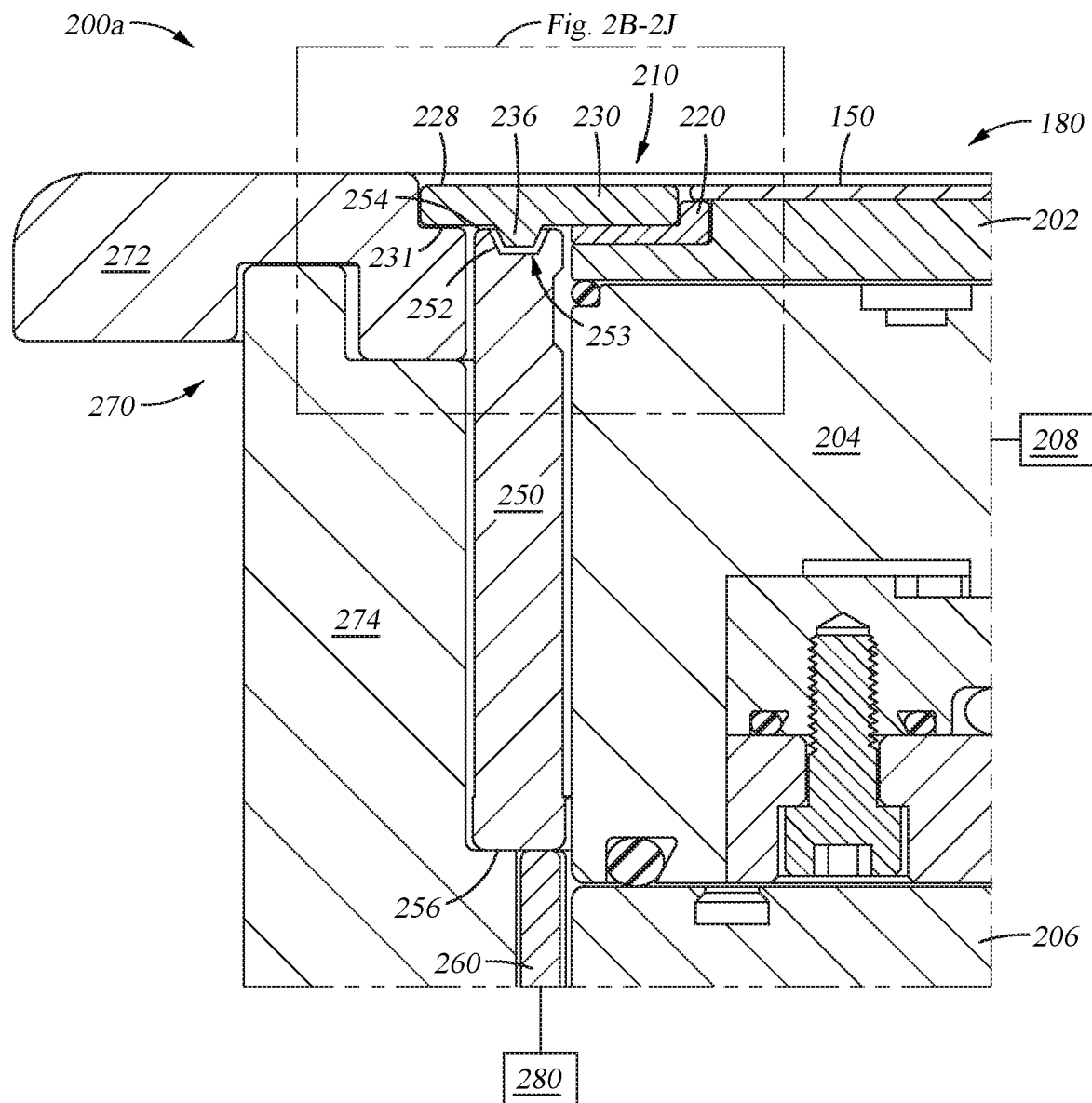
FIGS. 2A-2J depict enlarged partial cross-sectional views of multiple process kits containing various edge rings and adjustable tuning rings that include alignment couplings, according to one or more embodiments.

In the process kit 200a, as depicted FIG. 2A, the upper alignment coupling 236 is a male coupling with dovetail or trapezoidal geometry extending from the lower surface 231 of the second ring component 230. The lower alignment coupling 252 is a female coupling with dovetail or trapezoidal geometry formed into the upper surface 254 of the adjustable tuning ring 250.

Figure 2B:
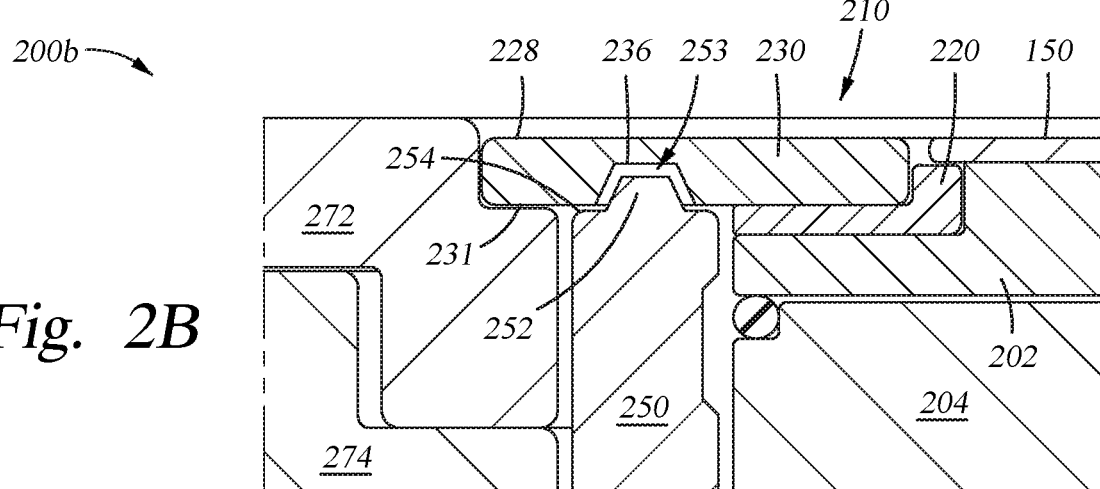

In the process kit 200b, as depicted FIG. 2B, the upper alignment coupling 236 is a female coupling with dovetail or trapezoidal geometry formed into the lower surface 231 of the second ring component 230. The lower alignment coupling 252 is a male coupling with dovetail or trapezoidal geometry extending from the upper surface 254 of the adjustable tuning ring 250.

Figure 2C:
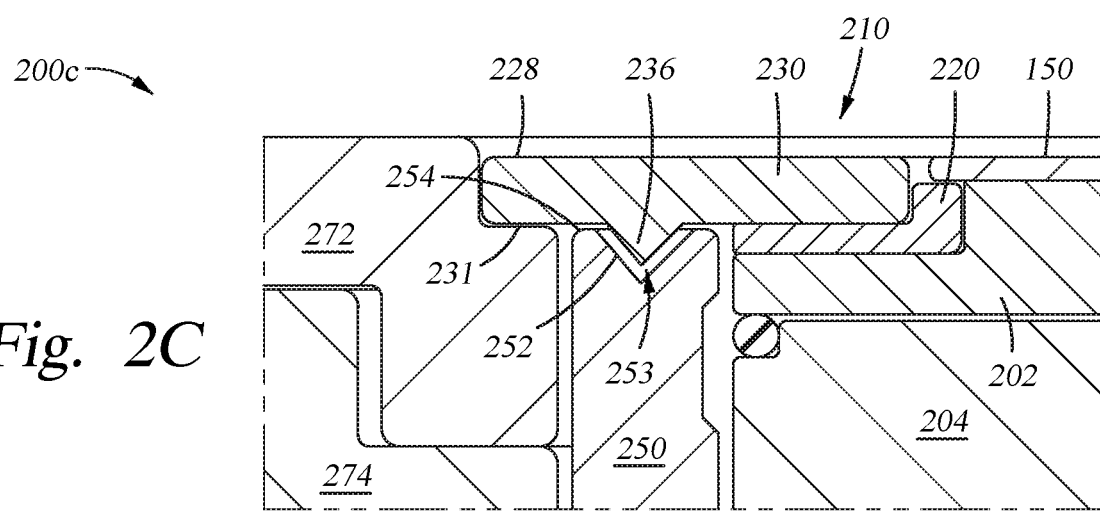

In the process kit 200c, as depicted FIG. 2C, the upper alignment coupling 236 is a male coupling with the triangular geometry extending from the lower surface 231 of the second ring component 230. The lower alignment coupling 252 is a female coupling with triangular geometry formed into the upper surface 254 of the adjustable tuning ring 250.

Figure 2D:
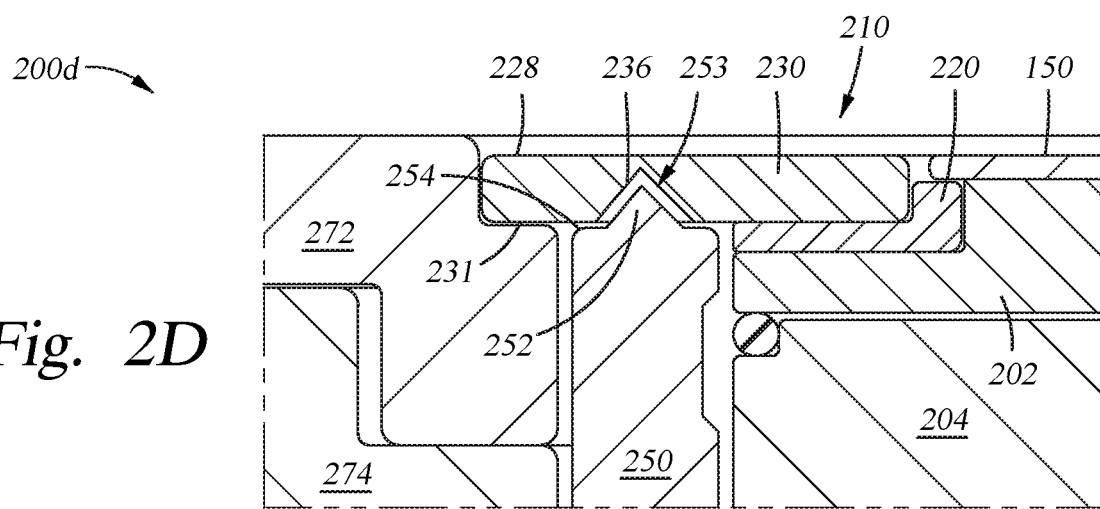

In the process kit 200d, as depicted FIG. 2D, the upper alignment coupling 236 is a female coupling with triangular geometry formed into the lower surface 231 of the second ring component 230. The lower alignment coupling 252 is a male coupling with triangular geometry extending from the upper surface 254 of the adjustable tuning ring 250.

Figure 2E:
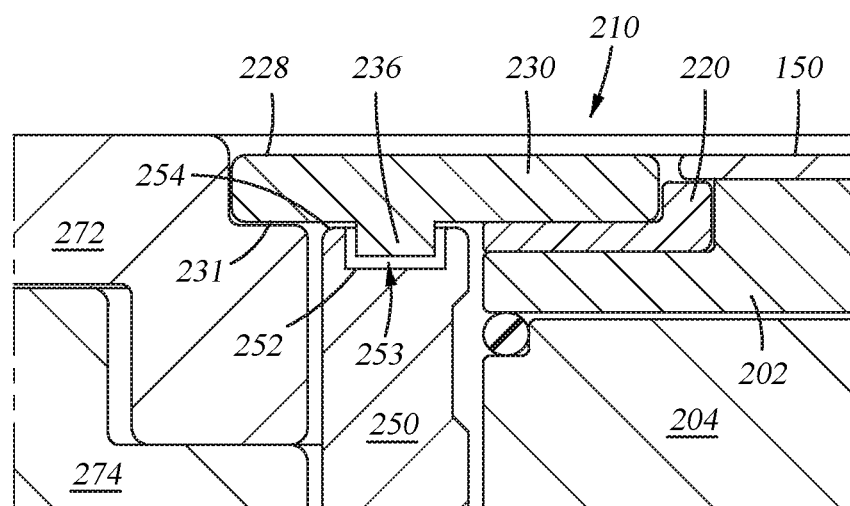

In the process kit 200e, as depicted FIG. 2E, the upper alignment coupling 236 is a male coupling with square or rectangular geometry extending from the lower surface 231 of the second ring component 230. The lower alignment coupling 252 is a female coupling with square or rectangular geometry formed into the upper surface 254 of the adjustable tuning ring 250.

Figure 2F:
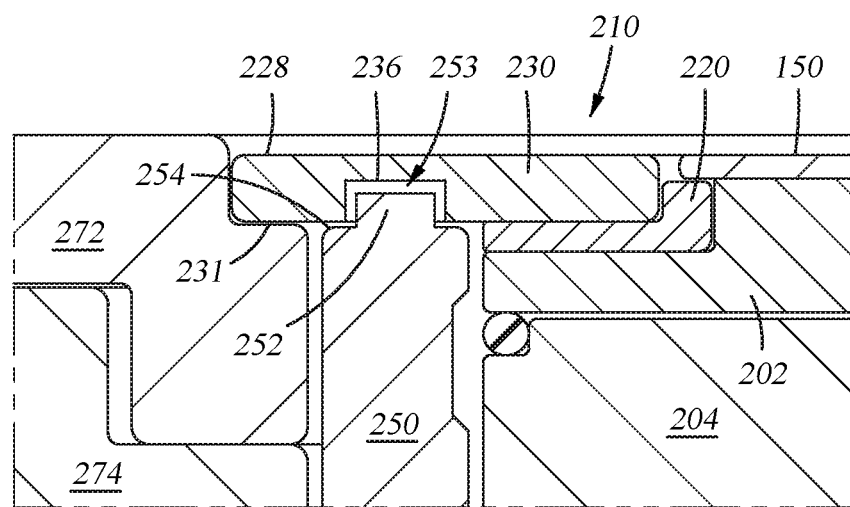

In the process kit 200f, as depicted FIG. 2F, the upper alignment coupling 236 is a female coupling with square or rectangular geometry formed into the lower surface 231 of the second ring component 230. The lower alignment coupling 252 is a male coupling with square or rectangular geometry extending from the upper surface 254 of the adjustable tuning ring 250.

Figure 2G:
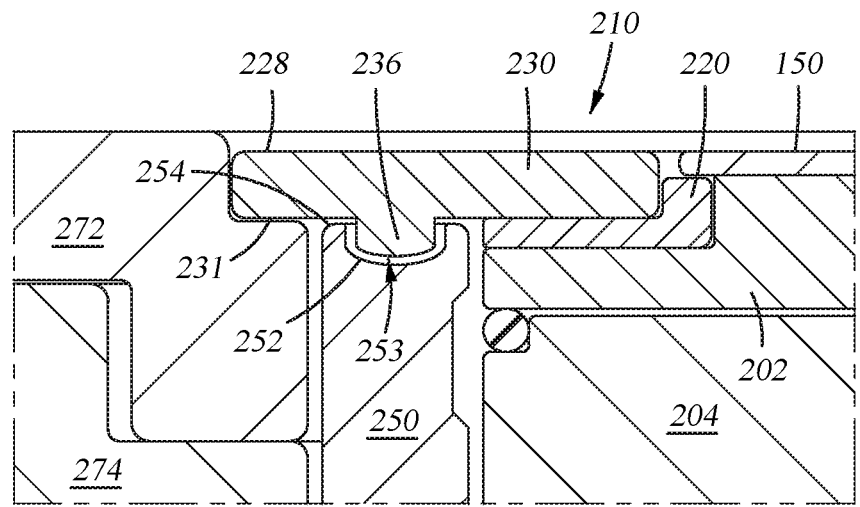

In the process kit 200g, as depicted FIG. 2G, the upper alignment coupling 236 is a male coupling with arced or rounded geometry extending from the lower surface 231 of the second ring component 230. The lower alignment coupling 252 is a female coupling with arced or rounded geometry formed into the upper surface 254 of the adjustable tuning ring 250.

Figure 2H:
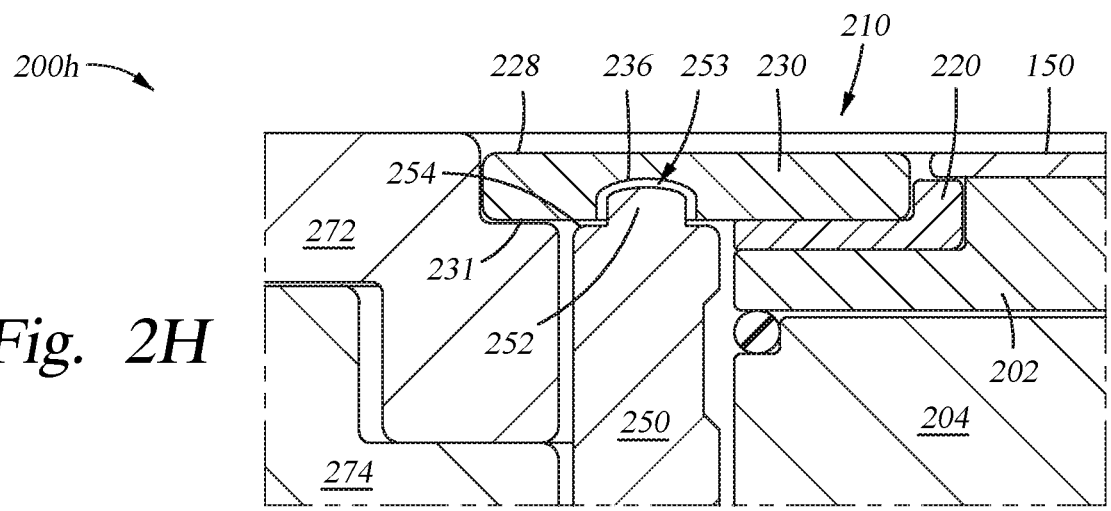

In the process kit 200h, as depicted FIG. 2H, the upper alignment coupling 236 is a female coupling with arced or rounded geometry formed into the lower surface 231 of the second ring component 230. The lower alignment coupling 252 is a male coupling with arced or rounded geometry extending from the upper surface 254 of the adjustable tuning ring 250.

Figure 2I:
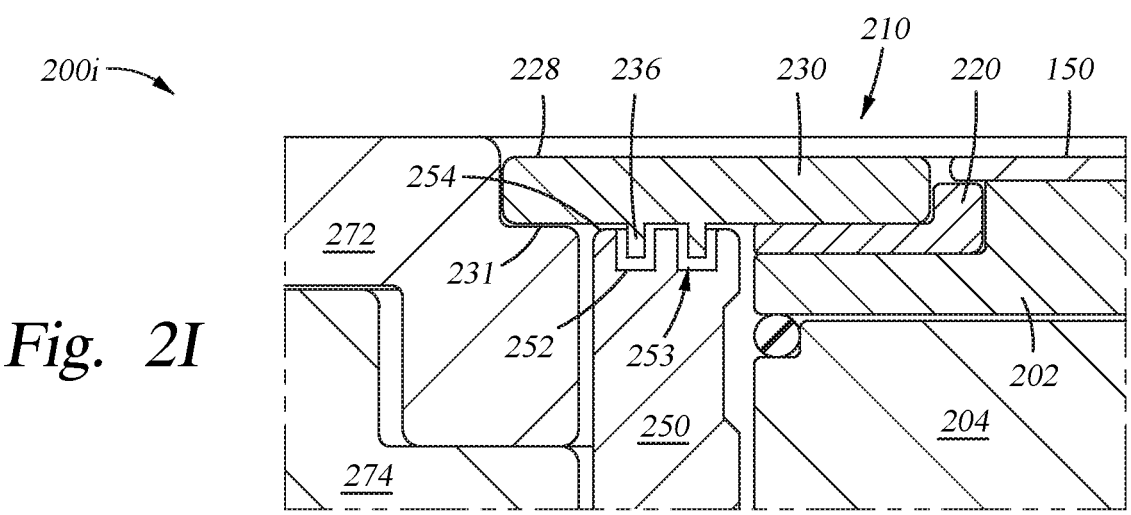

In the process kit 200i, as depicted FIG. 2I, the upper alignment coupling 236 is a male coupling with finned geometry extending from the lower surface 231 of the second ring component 230. The lower alignment coupling 252 is a female coupling with finned geometry formed into the upper surface 254 of the adjustable tuning ring 250.

Figure 2J:
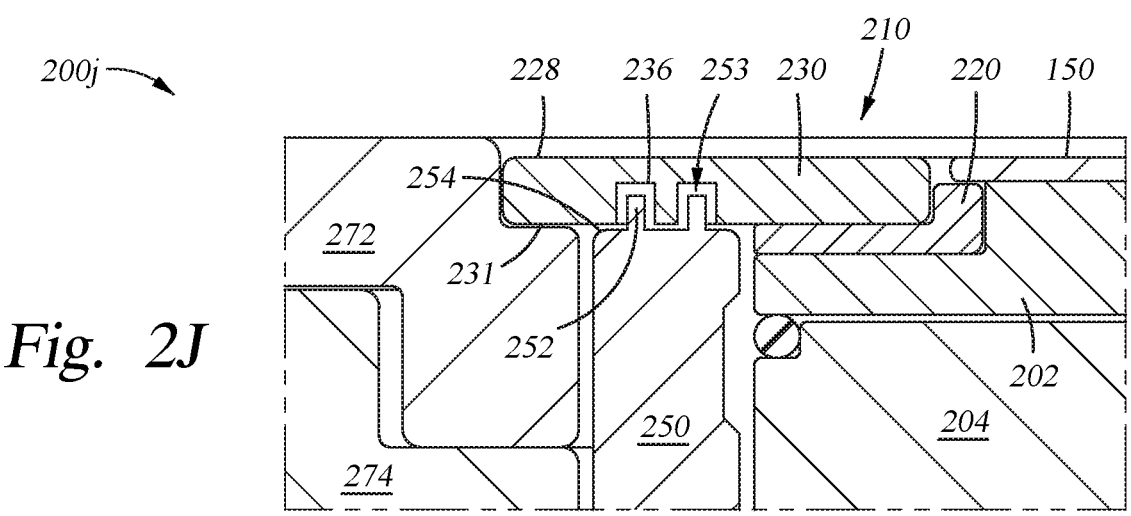

In the process kit 200j, as depicted FIG. 2J, the upper alignment coupling 236 is a female coupling with finned geometry formed into the lower surface 231 of the second ring component 230. The lower alignment coupling 252 is a male coupling with finned geometry extending from the upper surface 254 of the adjustable tuning ring 250.

The finned geometries can have two, three, or more shaped profiles, the same or different geometries, as male couplings and/or female couplings. The finned geometries can be of any coupling shown in FIGS. 2A-2J, as well as other geometric shapes. For example, the finned geometry can include two rectangular geometries (as shown in FIGS. 2I and 2J). Alternatively, the finned geometry can include two triangular geometries, a combination of a rectangular geometry and a triangular geometry, a combination of a rectangular geometry and a dovetail geometry, or any other combination.

A gap 253, as depicted in FIGS. 2A-2J, can be disposed between the upper surface 254 of the adjustable tuning ring 250 and the lower surface 231 of the second ring component 230. More specifically, the gap 253 is disposed between the lower alignment coupling 252 of the adjustable tuning ring 250 and the upper alignment coupling 236 of the second ring. The adjustable tuning ring 250 is actuated, adjusted, or otherwise moved to adjust the size of the gap 253 and vary a capacitive coupling between the adjustable tuning ring 250 and the second ring component 230. Therefore, by varying the distance between the adjustable tuning ring 250 and the second ring component 230 (e.g., size of gap 253), the capacitive coupling therebetween is proportionally varied.

In one or more embodiments, two distinct regimes are possible for tuning the plasma sheath 201. In one example, the size of the gap 253 may be variably maintained or adjusted between the adjustable tuning ring 250 and the second ring component 230. In another example, the adjustable tuning ring 250 and the second ring component 230 are touching or in contact with one another and therefore the gap 253 therebetween does not exist.

Figure 3:
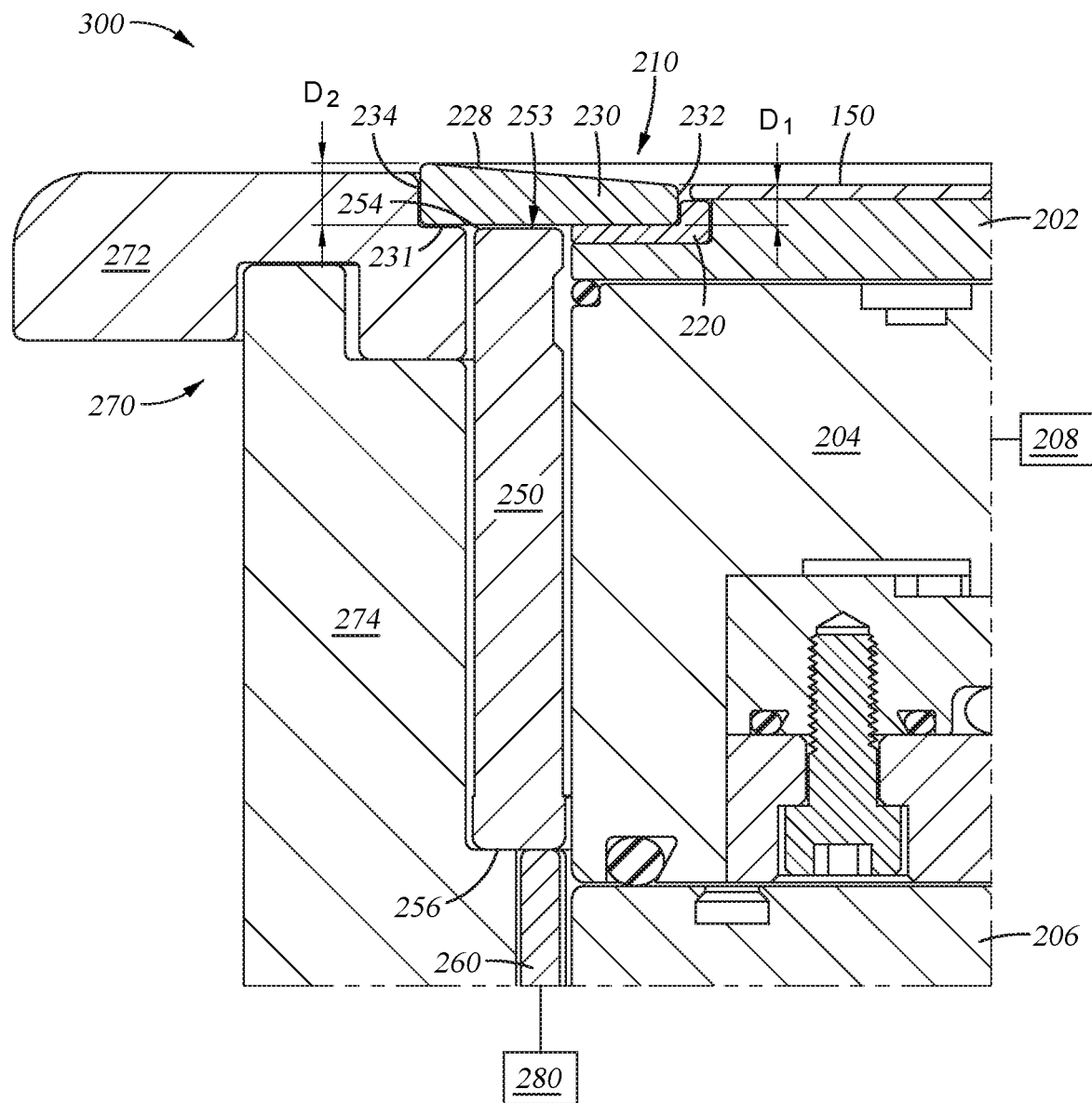
FIG. 3 depicts an enlarged partial cross-sectional view of a process kit containing an edge ring with an inwardly angled upper surface, according to one or more embodiments.
Figure 4A:
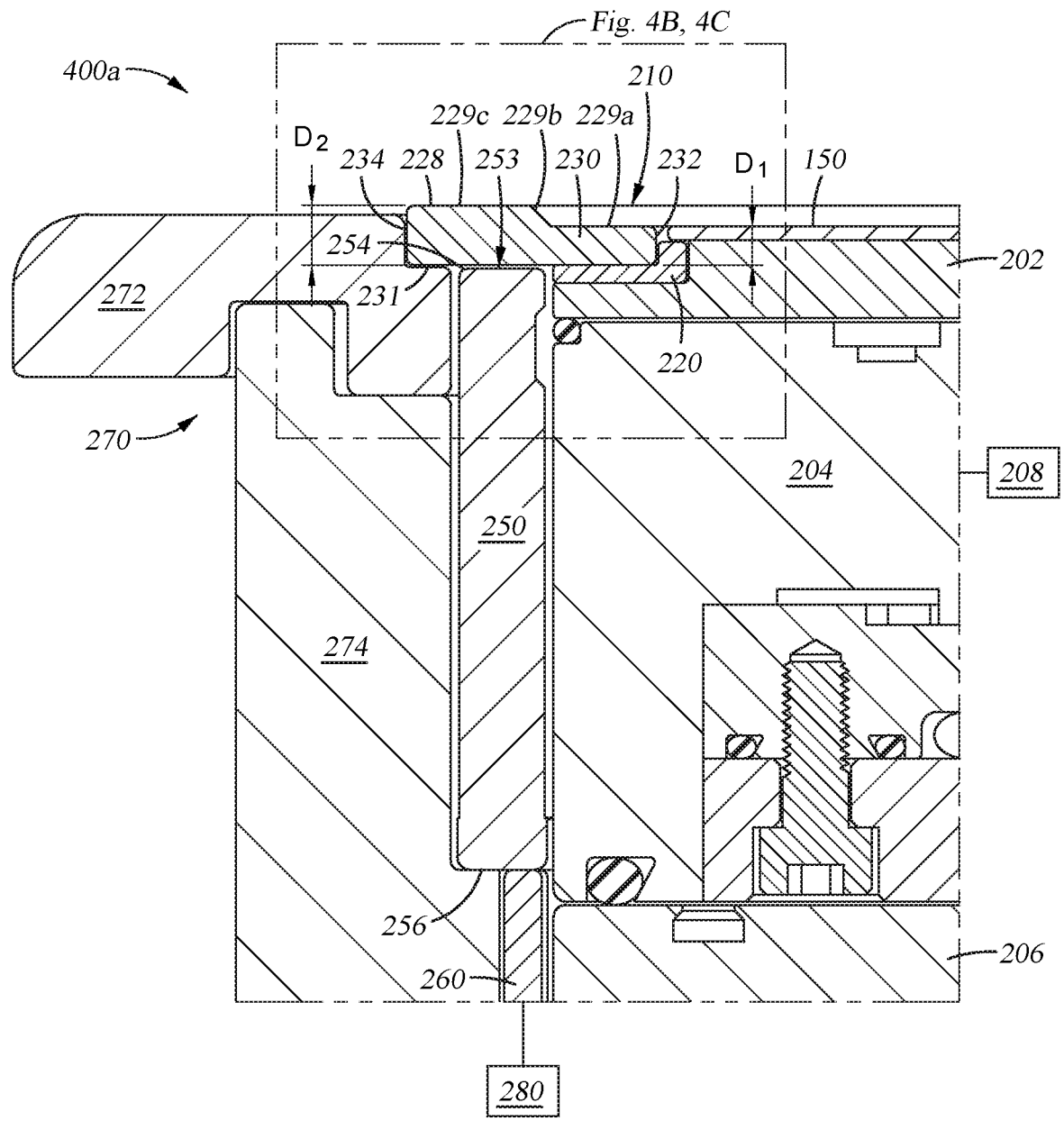
FIGS. 4A-4C depict enlarged partial cross-sectional views of other process kits, containing edge rings with another inwardly angled or beveled upper surfaces, according to one or more embodiments.
Figure 4B:
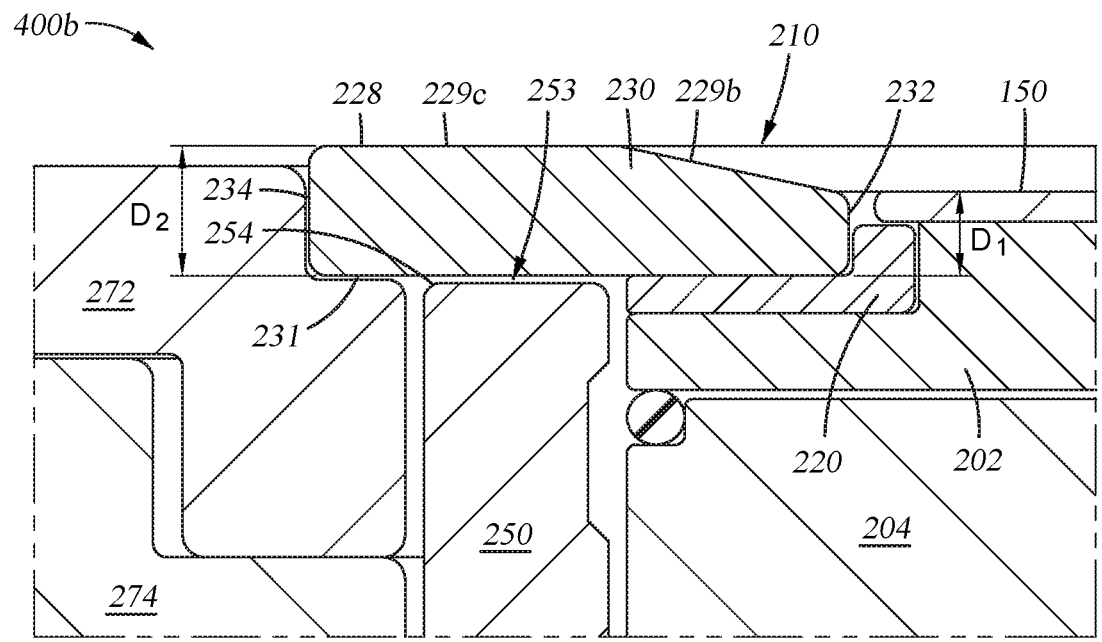
Figure 4C:
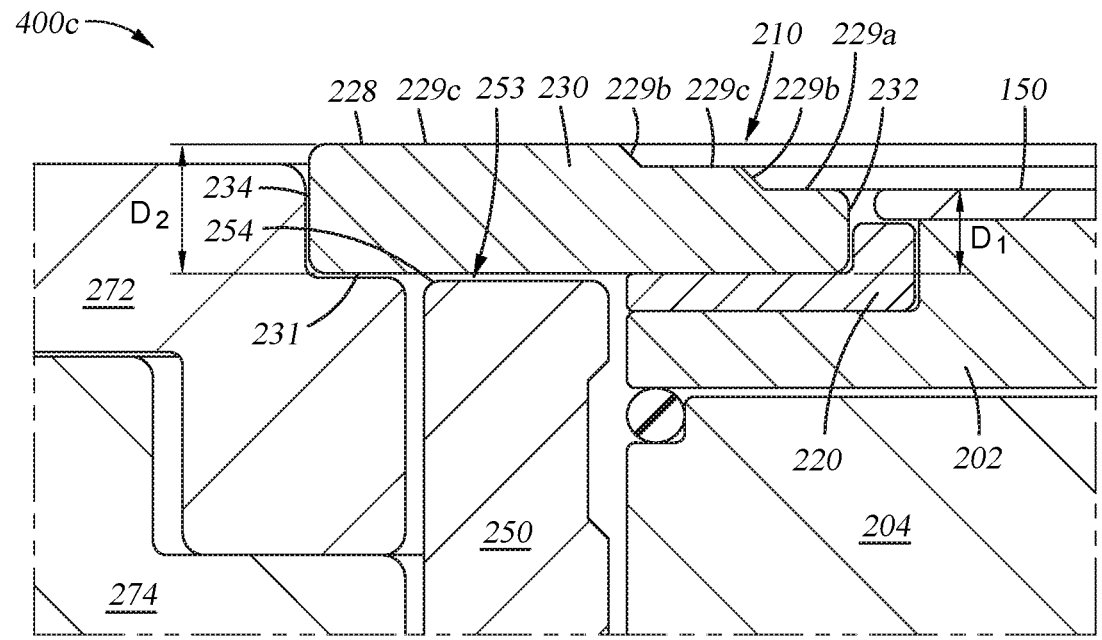

FIG. 3 depicts an enlarged partial cross-sectional view of a process kit 300 containing the edge ring 210 with an inwardly angled upper surface 228, according to one or more embodiments. FIG. 4A depicts an enlarged partial cross-sectional view of a process kit 400a containing the edge ring 210 with an inwardly beveled upper surface 228, according to one or more embodiments. FIGS. 4B and 4C depict enlarged partial cross-sectional views of process kits 400b, 400c, respectively, containing the edge ring 210 with inwardly beveled upper surfaces 228. For the process kits 300 and 400a-400c, the first ring component 220 is interfaced with the second ring component 230 such that the second ring component 230 is movable relative to the first ring component 220 forming the gap 253 therebetween. Any of the process kits 300 and 400a-400c can be used in the processing chamber 100 by replacing the process kit 200 or any of the process kits 200a-200j, completely or in part, with any of the process kits 300 or 400a-400c.

In one or more embodiments, at least a portion of the upper surface 228 of the second ring component 230 is inwardly angled towards the first ring component 220. In one embodiment, the upper surface 228 of the second ring component 230 is inwardly angled from the outer edge 234 to the inner edge 232, as depicted in FIG. 3. In another embodiment, as depicted in FIG. 4A, a portion or segment of the upper surface 228 of the second ring component 230 is inwardly angled away from the outer edge 234 and towards the inner edge 232. The upper surface 228 of the second ring component 230 can have a beveled upper surface 229b disposed between an inner upper surface 229a and an outer upper surface 229c. The beveled upper surface 229b is inwardly angled towards the inner edge 232, such as towards the first ring component 220 and/or the substrate 150. The inner upper surface 229a and the outer upper surface 229c can be parallel or substantially parallel to one another, as depicted in FIG. 4A. Alternatively, the inner upper surface 229a and the outer upper surface 229c are not parallel to one another (not shown).

In another embodiment, as depicted in FIG. 4B, a portion or segment of the upper surface 228 of the second ring component 230 is inwardly angled away from the outer edge 234 and towards the inner edge 232. The upper surface 228 of the second ring component 230 can have the inwardly angled or beveled upper surface 229b disposed adjacent to the outer upper surface 229c. In another embodiment, as depicted in FIG. 4C, two or more portions or segments of the upper surface 228 of the second ring component 230 are inwardly angled from the outer edge 234 to the inner edge 232. The upper surface 228 of the second ring component 230 can have the inner upper surface 229a, next to a first inwardly angled or beveled upper surface 229b, next to a first outer upper surface 229c, next to a second inwardly angled or beveled upper surface 229b, next to a second outer upper surface 229c. The beveled upper surfaces 229b, as shown in FIGS. 2B and 2C, are inwardly angled towards the inner edge 232, such as towards the first ring component 220 and/or the substrate 150.

During processing, the inwardly angled upper surface 228 (FIG. 3) and the inner upper surfaces 229a (FIGS. 4A-4C) funnel or otherwise direct plasma towards the inner edge 232 of the second ring component 230, the upper surface 218 of the first ring component 220, and the substrate 150. As such, the inwardly angled upper surface 228 (FIG. 3) and the inner upper surfaces 229a (FIGS. 4A-4C) direct plasma away from the outer edge 224 of the second ring component 230 and the cover ring 272.

The second ring component 230 has an inner thickness D1 and an outer thickness D2, as measured between the upper surface 228 and the lower surface 231. For the second ring component 230 depicted in FIGS. 4A-4C, the inner thickness D1 is measured between the inner upper surface 229a and the lower surface 231, and the outer thickness D2 is measured between the outer upper surface 229c and the lower surface 231. The inner thickness D1 is less than the outer thickness D2, as shown in FIGS. 3 and 4A-4C. The inner thickness D1 of the second ring component 230 is about 1 mm, about 1.8 mm, about 2 mm, or about 2.5 mm to about 3 mm, about 4 mm, about 5 mm, or about 6 mm. The outer thickness D2 of the second ring component 230 is about 1 mm, about 2 mm, or about 3 mm to about 5 mm, about 7 mm, about 10 mm, about 12 mm, or about 15 mm.

Figure 5:
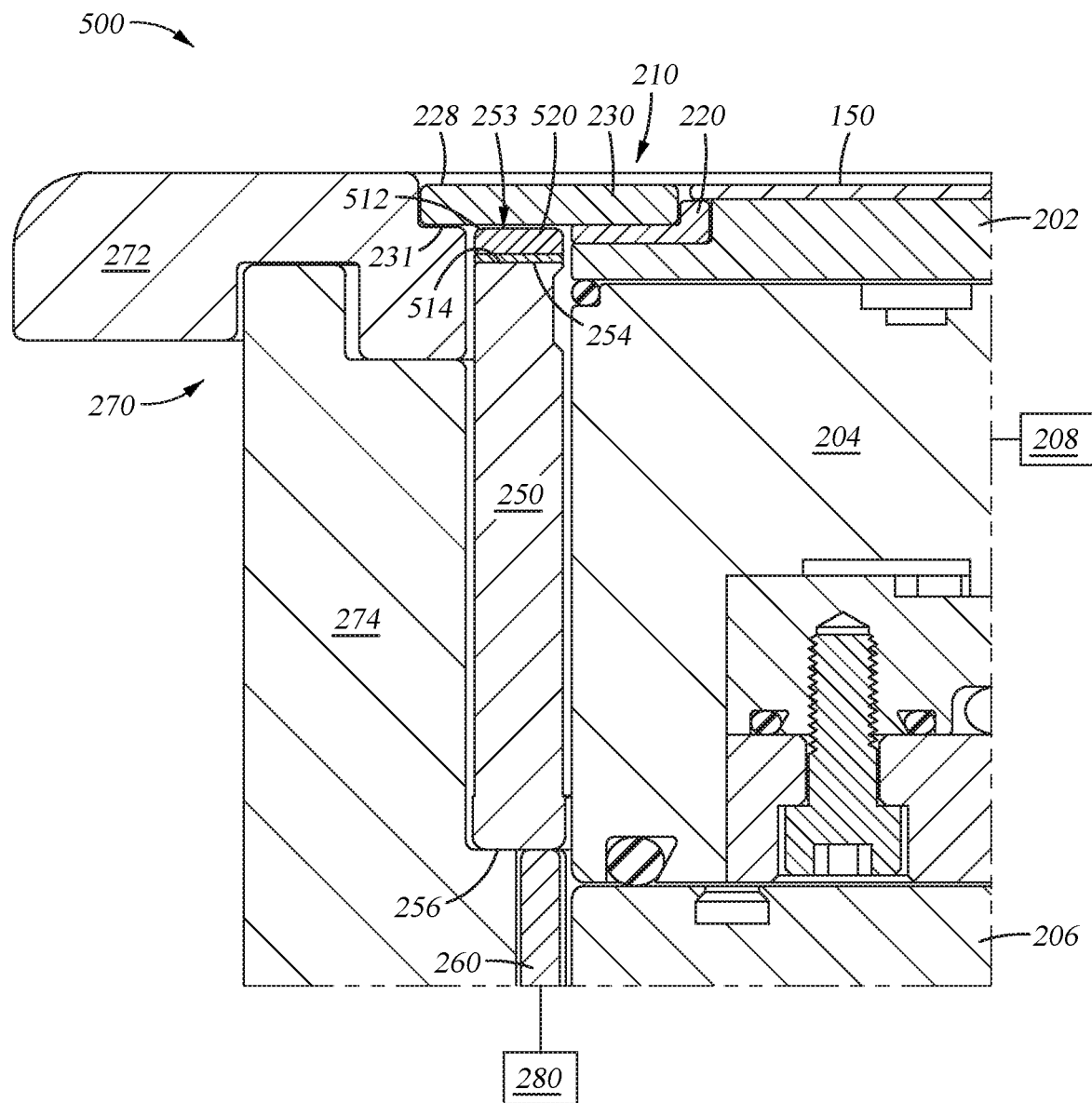
FIG. 5 depicts an enlarged partial cross-sectional view of another process kit containing an edge ring, a sliding ring, and an adjustable tuning ring, according to one or more embodiments.

FIG. 5 depicts an enlarged partial cross-sectional view of a process kit 500 containing the edge ring 210, a sliding ring 520, and the adjustable tuning ring 250, according to one or more embodiments. The sliding ring 520 is positioned beneath the edge ring 210. The siding ring 520 has an upper surface 512 and a lower surface 514. The upper surface 512 of the sliding ring 520 is in contact with the lower surface 231 of the second ring component 230. The adjustable tuning ring 250 is positioned beneath the sliding ring 520. The upper surface 254 of the adjustable tuning ring 250 is in contact with the lower surface 514 of the sliding ring 520.

In one or more embodiments, in absence of the sliding ring 520, the plasma can erode portions of the adjustable tuning ring 250 during processing. Once placed between the second ring component 230 and the adjustable tuning ring 250, the sliding ring 520 reduces the amount particulate formed (from plasma erosion) and collected between the second ring component 230 and the adjustable tuning ring 250 as opposed to not including the sliding ring 520 and contacting the second ring component 230 directly with the adjustable tuning ring 250.

The first ring component 220 of the edge ring 210 is interfaced with the second ring component 230 of the edge ring 210 such that the second ring component 230 is movable relative to the first ring component 220 forming a gap (not shown in FIG. 5) therebetween. The actuating mechanism 280 is interfaced with the lower surface 256 of the adjustable tuning ring 250. The actuating mechanism 280 moves or actuates the adjustable tuning ring 250 and the sliding ring 520 such that the gap 253 between the upper surface 512 of the sliding ring 520 and the lower surface 231 of the second ring component 230 is varied. Similarly, the actuating mechanism 280 moves or actuates the adjustable tuning ring 250 and the sliding ring 520 in contact with the second ring component 230 the size of the gap between the second ring component 230 is varied.

In one or more embodiments, the sliding ring 520 can include a body or a matrix that is made from or contains aluminum or an aluminum alloy. The body or matrix of the sliding ring 520 can be completely or partially coated with a plasma resistant coating or film that contains anodized oxide (e.g., aluminum oxide layer formed by any anodizing process), yttrium oxide, hafnium oxide, silicon carbide, oxides thereof, or any combination thereof. In other embodiments, the sliding ring 520 can include two or more segments or portions of varying materials, such as a split structure containing two or more rings. For example, the sliding ring 520 can include an upper segment that contains a ring made from or containing one or more plasma resistant materials (e.g., silicon carbide) and a lower segment that contains a ring made from or containing one or more electrically conductive materials (e.g., aluminum or an aluminum alloy). The lower segment of the sliding ring 520 provides RF coupling with the electrostatic chuck 202. The two or more segments forming the sliding ring 520 can be bonded together or held together by gravity. In one or more examples, the upper segment (e.g., silicon carbide) and the lower segment (e.g., aluminum or an aluminum alloy) of the sliding ring 520 can be bonded or otherwise joined together by diffusion aluminum bonding to form the sliding ring 520 that can be RF coupled with the cooling plate 204.

Figure 6:
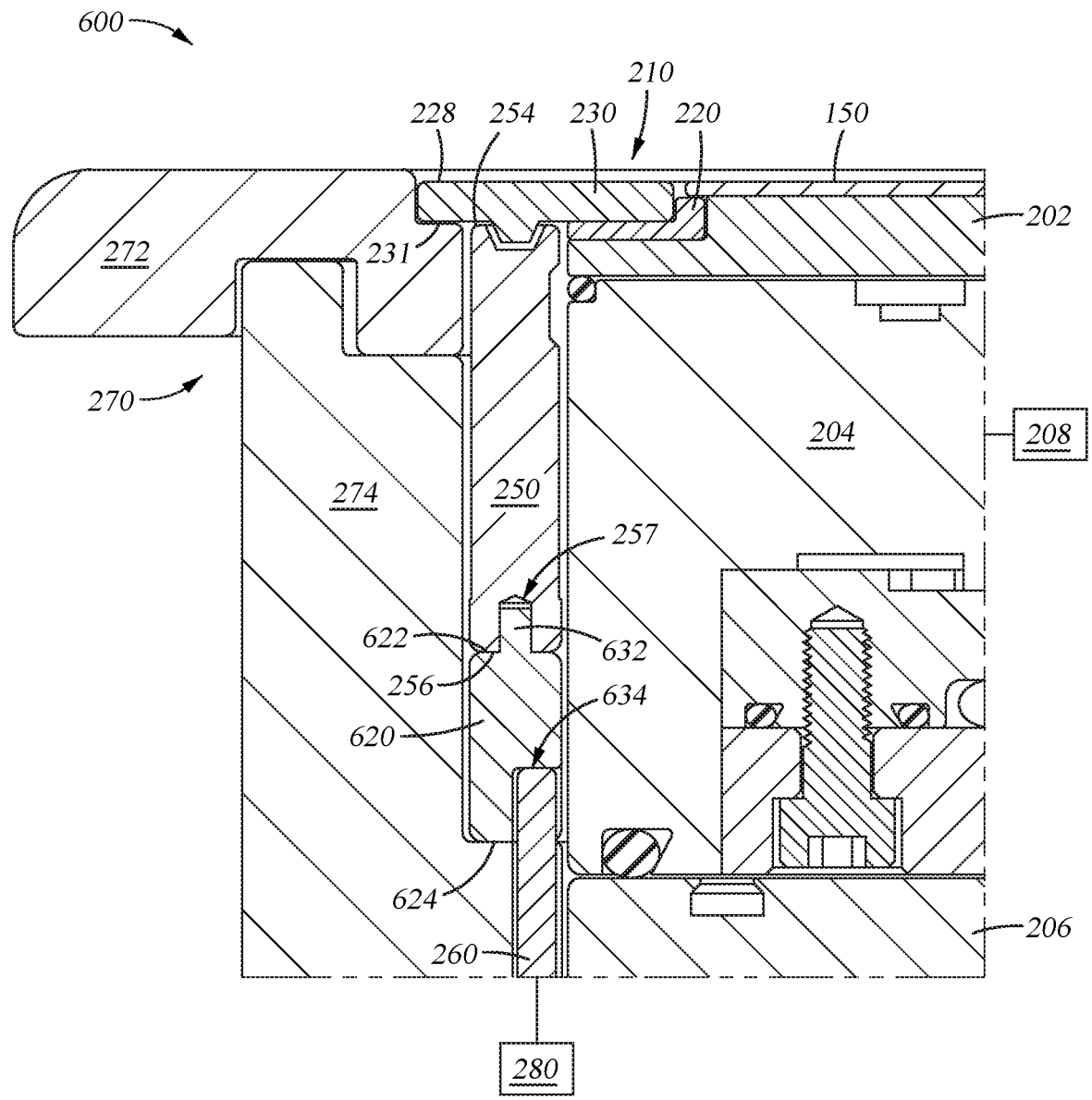
FIG. 6 depicts an enlarged partial cross-sectional view of another process kit containing an electrically insulating support ring disposed between an adjustable tuning ring and the actuating mechanism, according to one or more embodiments.

FIG. 6 depicts an enlarged partial cross-sectional view of a process kit 600 containing an electrically insulating support ring 620 disposed between the adjustable tuning ring 250 and the actuating mechanism 280, according to one or more embodiments. Each actuating mechanisms 280 includes the lift pin 260. For example, the insulating support ring 620 is positioned or otherwise disposed between and contacting the adjustable tuning ring 250 and the lift pin 260. Once placed between the adjustable tuning ring 250 and the actuating mechanism 280, the insulating support ring 620 reduces the amount particulate formed and collected between the adjustable tuning ring 250 and the actuating mechanism 280 relative to if the insulating support ring 620 was not used and instead, the lift pin 260 was directly contacting or connecting with the adjustable tuning ring 250.

The insulating support ring 620 has an upper surface 622 and a lower surface 624. In one or more embodiments, as shown in FIG. 6, each of the upper surface 622 and the lower surface 624 independently includes one or more alignment couplings 632 and 634. The alignment coupling 632 is a male coupling disposed on the upper surface 622 and the alignment coupling 634 is a female coupling disposed on the lower surface 624. Alternatively, not shown, the alignment coupling 632 can be a female coupling and the alignment coupling 634 can be a male coupling. As depicted on FIG. 6, an alignment coupling 257 (female coupling shown) is on the lower surface 256 of the adjustable tuning ring 250 and the alignment coupling 632 is disposed on the upper surface 622 of the insulating support ring 620 mate to form a reciprocal or mating profile therebetween. In another embodiment, not shown, neither the adjustable tuning ring 250 nor the insulating support ring 620 have an alignment coupling and the upper surface 622 of the insulating support ring 620 is on contact with the lower surface 256 of the adjustable tuning ring 250.

In another embodiment, the alignment coupling 634 can be or include one, two, three, four, or more female couplings, such as slots or holes, formed within the lower surface 624 of the insulating support ring 620. The female alignment couplings 634 can mate with a lift pin 260. Therefore, in some examples, there is the same number of female alignment couplings 634 as is the number of lift pins 260. In one or more examples, the insulating support ring 620 has two, three, four, or more alignment couplings 634 that are slots extending from the lower surface 624 of the insulating support ring 620 towards the upper surface 622 of the insulating support ring 620, and each slot contains a lift pin 260 disposed therein. In another embodiment, not shown, the insulating support ring 620 does not have an alignment coupling so that the lift pin 260 makes contact directly to the lower surface 624 of the insulating support ring 620 when lifting and lowering the insulating support ring 620 and the adjustable tuning ring 250.

The insulating support ring 620 contains one or more polymeric materials which can be or include one or more fluorinated carbons, fluorinated hydrocarbons, thermoset cross linked polystyrene copolymers (e.g., a REXOLITE® polymer), ceramics, or any combination thereof. In one or more examples, the insulating support ring 620 contains a polytetrafluoroethylene (PTFE) material.

Although FIG. 6 depicts an upper alignment coupling that is a male coupling on the lower surface 231 of the second ring component 230 and a lower alignment coupling that is a female coupling on the upper surface 254 of the adjustable tuning ring 250, each of the lower surface 231 and the upper surface 254 can independently have any type of male or female coupling (as illustrated in FIGS. 2A-2J), as well as, an absence of a coupling (as illustrated in FIGS. 1C and 1D), such that the lower surface 231 of the second ring component 230 and the upper surface 254 of the adjustable tuning ring 250 make contact to each without a coupling.

Figure 7A:
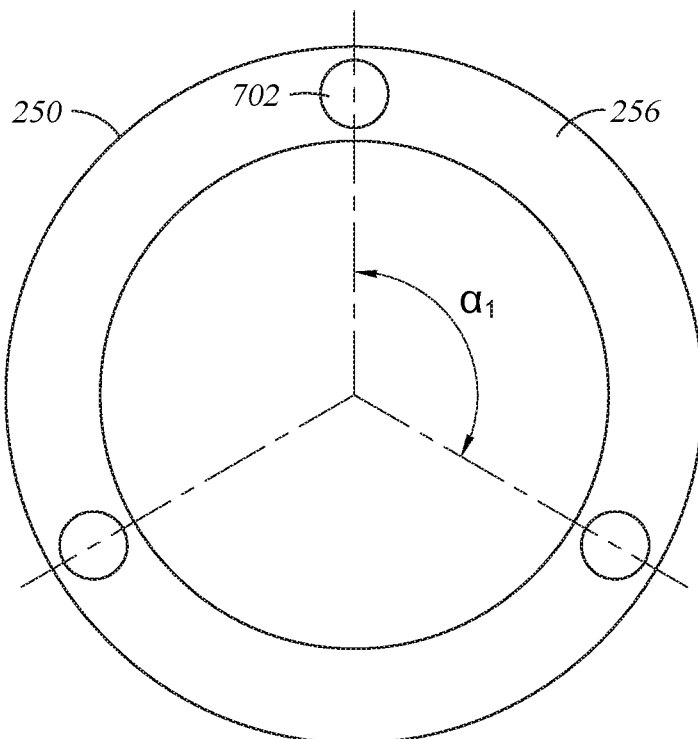
FIGS. 7A and 7B depict bottom views of an adjustable tuning ring illustrating placement locations for actuating mechanisms, according to one or more embodiments.
Figure 7B:
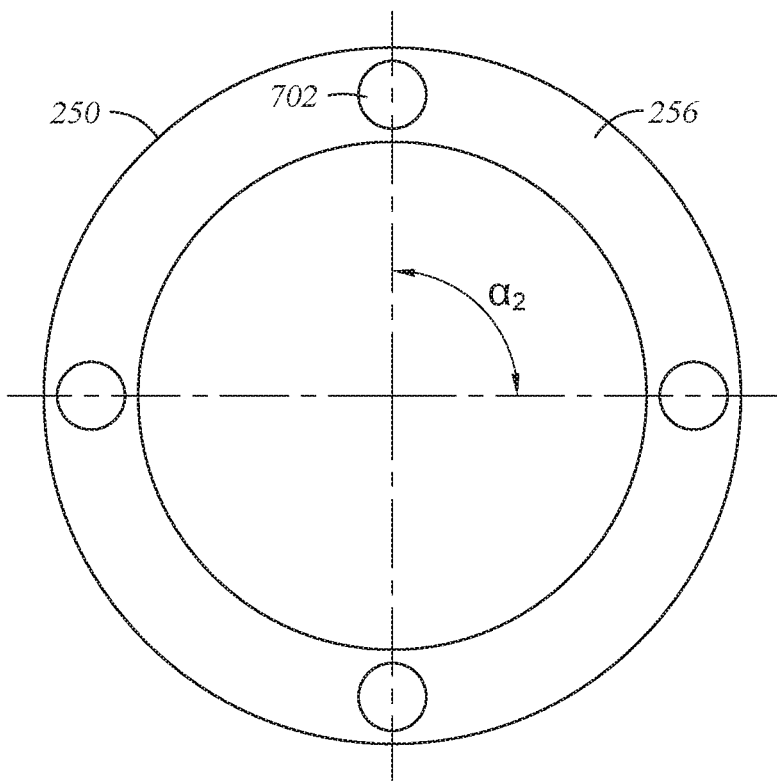

FIGS. 7A and 7B depict bottom views of the adjustable tuning ring 250 illustrating placement locations for actuating mechanisms 280, according to one or more embodiments. FIG. 7A depicts three positions 702 disposed on the lower surface 256 of the adjustable tuning ring 250. In one example, these positions 702 are at the locations where the upper ends of the actuating mechanisms 280, such as the lift pins 260, make contact to the lower surface 256. The three positions 702 are separated from each other by an angle $\alpha_1$ of about 110 degrees to about 130 degrees, about 115 degrees to about 125 degrees, or about 118 degrees to about 122 degrees, for example, about 120 degrees, as measured from the center of the adjustable tuning ring 250.

FIG. 7B depicts four positions 702 disposed on the lower surface 256 of the adjustable tuning ring 250. In another example, each of these positions 702 is at the location where the upper end of the actuating mechanisms 280, such as the lift pin 260, makes contact to the lower surface 256. The four positions 702 are separated from each other by an angle $\alpha_2$ of about 80 degrees to about 100 degrees, about 85 degrees to about 95 degrees, or about 88 degrees to about 92 degrees, for example, about 90 degrees, as measured from the center of the adjustable tuning ring 250.

Figure 8:
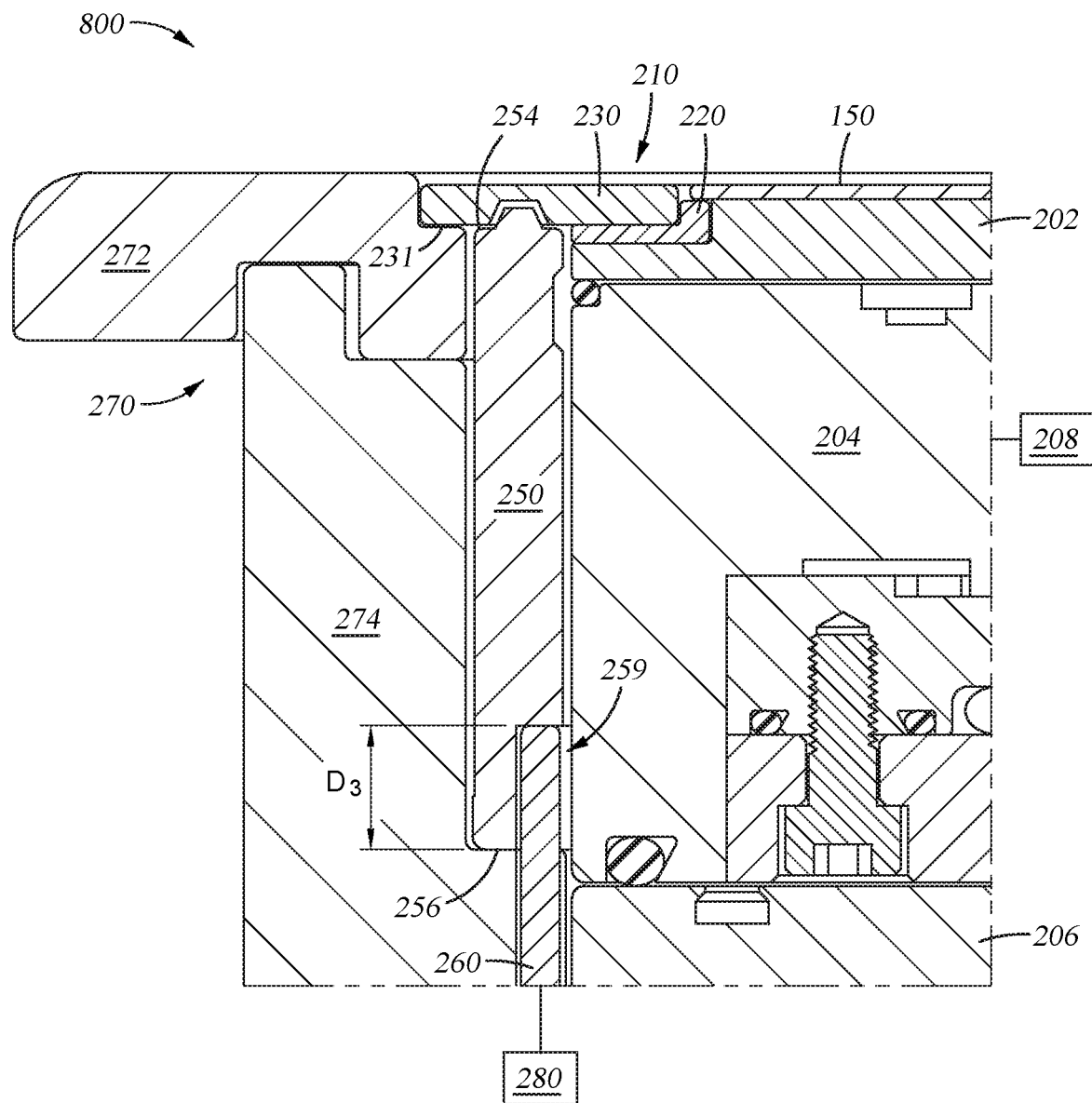
FIG. 8 depicts an enlarged partial cross-sectional view of a process kit containing an adjustable tuning ring having slots used to contain the actuating mechanisms, according to one or more embodiments.

FIG. 8 depicts an enlarged partial cross-sectional view of a process kit 800 containing the adjustable tuning ring 250 having alignment couplings 259 that are used to contain at least a portion of the actuating mechanisms 280, according to one or more embodiments. The alignment couplings 259 can be or include one, two, three, four, or more female couplings, such as slots or holes, formed within the lower surface 256 of the adjustable tuning ring 250.

The female alignment couplings 259 can mate with a lift pin 260, as shown in FIG. 8. Therefore, in some examples, there is the same number of female alignment couplings 259 as is the number of lift pins 260. In one or more examples, adjustable tuning ring 250 has two, three, four, or more alignment couplings 259 that are slots extending from the lower surface 256 of the adjustable tuning ring 250 towards the upper surface 254 of the adjustable tuning ring 250, and each slot contains a lift pin 260 disposed therein. The alignment couplings 259 can extend from the lower surface 256 a distance D3 into the adjustable tuning ring 250. For example, the distance D3 can be about 1 mm, about 2 mm, about 3 mm, or about 4 mm to about 5 mm, about 7 mm, about 10 mm, about 12 mm, or about 15 mm.

Although FIG. 8 depicts an upper alignment coupling that is a female coupling on the lower surface 231 of the second ring component 230 and a lower alignment coupling that is a male coupling on the upper surface 254 of the adjustable tuning ring 250, each of the lower surface 231 and the upper surface 254 can independently have any type of male or female coupling (as illustrated in FIGS. 2A-2J), as well as, an absence of a coupling (as illustrated in FIGS. 1C and 1D), such that the lower surface 231 of the second ring component 230 and the upper surface 254 of the adjustable tuning ring 250 make contact to each without a coupling.

Figure 9A:
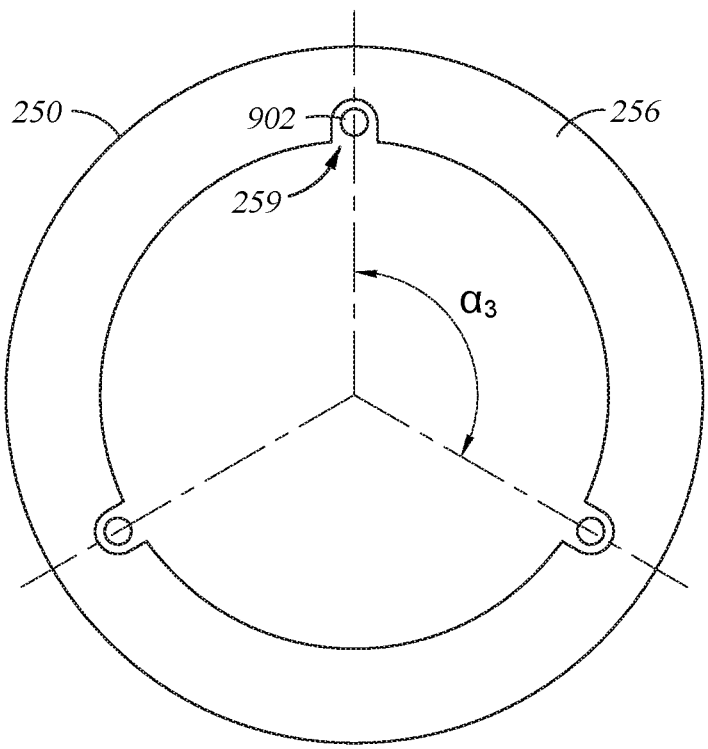
FIGS. 9A and 9B depict bottom views of the adjustable tuning ring illustrated in FIG. 8, according to one or more embodiments.
Figure 9B:
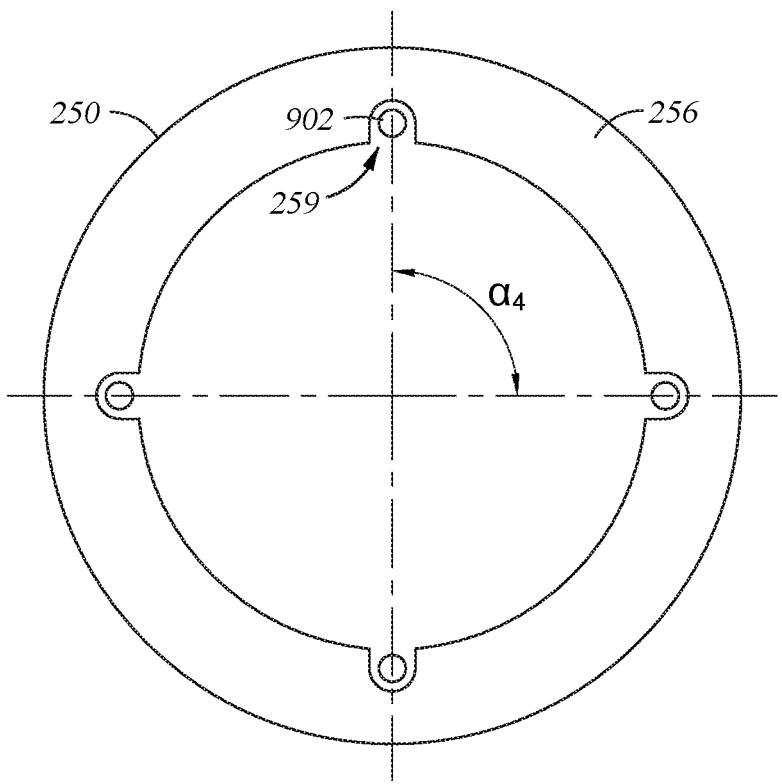

FIGS. 9A and 9B depict bottom views of the adjustable tuning ring 250 illustrated in FIG. 8, according to one or more embodiments. FIG. 9A depicts three of the slots or female alignment couplings 259 formed in the adjustable tuning ring 250 and containing points 902 therein. In one example, these points 902 are at the locations where the actuating mechanisms 280, such as the lift pins 260, are inserted or otherwise disposed into the female alignment couplings 259. The three slots or female alignment couplings 259 are separated from each other by an angle α3 of about 110 degrees to about 130 degrees, about 115 degrees to about 125 degrees, or about 118 degrees to about 122 degrees, for example, about 120 degrees, as measured from the center of the adjustable tuning ring 250.

FIG. 9B depicts four of the slots or female alignment couplings 259 formed in the adjustable tuning ring 250 and containing points 902 therein. In another example, these points 902 are at the locations where the actuating mechanisms 280, such as the lift pins 260, are inserted or otherwise disposed into the female alignment couplings 259. The four slots or female alignment couplings 259 are separated from each other by an angle α4 of about 80 degrees to about 100 degrees, about 85 degrees to about 95 degrees, or about 88 degrees to about 92 degrees, for example, about 90 degrees, as measured from the center of the adjustable tuning ring 250.

Embodiments of the present disclosure further relate to any one or more of the following paragraphs:

1. A process kit for a substrate processing chamber, comprising: an edge ring having a first ring component and a second ring component, the first ring component interfaced with the second ring component such that the second ring component is movable relative to the first ring component forming a gap therebetween, the second ring component having an upper surface and a lower surface, the lower surface of the second ring component comprising an upper alignment coupling; an adjustable tuning ring positioned beneath the edge ring, the adjustable tuning ring having an upper surface and a lower surface, the upper surface of the adjustable tuning ring comprising a lower alignment coupling, the upper surface of the adjustable tuning ring is configured to contact the lower surface of the second ring component, and the lower alignment coupling of the adjustable tuning ring is configured to mate with the upper alignment coupling of the second ring component to form an interface; and an actuating mechanism interfaced with the lower surface of the adjustable tuning ring, the actuating mechanism configured to actuate the adjustable tuning ring such that the gap between the first ring component and the second ring component is varied.

2. A processing chamber, comprising: a substrate support member configured to support a substrate; and a process kit supported by the substrate support member, the process kit comprising: an edge ring having a first ring component and a second ring component, the first ring component interfaced with the second ring component such that the second ring component is movable relative to the first ring component forming a gap therebetween, the second ring component having an upper surface and a lower surface, the lower surface of the second ring component comprising an upper alignment coupling; an adjustable tuning ring positioned beneath the edge ring, the adjustable tuning ring having an upper surface and a lower surface, the upper surface of the adjustable tuning ring comprising a lower alignment coupling, the upper surface of the adjustable tuning ring is configured to contact the lower surface of the second ring component, and the lower alignment coupling of the adjustable tuning ring is configured to mate with the upper alignment coupling of the second ring component to form an interface; and an actuating mechanism interfaced with the lower surface of the adjustable tuning ring, the actuating mechanism configured to actuate the adjustable tuning ring such that the gap between the first ring component and the second ring component is varied.

3. The processing chamber of paragraph 2, wherein the substrate support member comprises: a base; a cooling plate supported by the base; and an electrostatic chuck positioned on an upper surface of the cooling plate.

4. The process kit or the processing chamber according to any one of paragraphs 1-3, wherein the upper alignment coupling is a male coupling and the lower alignment coupling is a female coupling, or the upper alignment coupling is the female coupling and the lower alignment coupling is the male coupling.

5. The process kit or the processing chamber of paragraph 4, wherein the interface formed by the male coupling and the female coupling has a mating profile, and wherein the mating profile is selected from the group consisting of dovetail, spline, finned, triangular, rectangular, square, trapezoidal, arced, and rounded.

6. The process kit or the processing chamber according to any one of paragraphs 1-5, further comprising a gap disposed between the upper surface of the adjustable tuning ring and the lower surface of the second ring component and disposed between the lower alignment coupling of the adjustable tuning ring and the upper alignment coupling of the second ring.

7. The process kit or the processing chamber of paragraph 6, wherein the actuating mechanism is configured to actuate the adjustable tuning ring such that the gap between the lower alignment coupling and the upper alignment coupling is varied.

8. The process kit or the processing chamber according to any one of paragraphs 1-7, further comprising an electrically insulating support ring disposed between the adjustable tuning ring and the actuating mechanism.

9. The process kit or the processing chamber of paragraph 8, wherein the insulating support ring comprises a polytetrafluoroethylene material.

10. The process kit or the processing chamber of paragraph 8, wherein the actuating mechanism comprises a lift pin, and wherein the insulating support ring is between and contacting the adjustable tuning ring and the lift pin.

11. The process kit or the processing chamber of paragraph 10, wherein an alignment coupling on the lower surface of the adjustable tuning ring and an alignment coupling on an upper surface of the insulating support ring mate to form a mating profile therebetween.

12. The process kit or the processing chamber of paragraph 8, wherein the insulating support ring mate comprises three or more slots extending from a lower surface of the insulating support ring mate towards an upper surface of the insulating support ring mate, and wherein each slot contains a lift pin disposed therein.

13. The process kit or the processing chamber according to any one of paragraphs 1-12, wherein the adjustable tuning ring comprises an electrically conductive material.

14. The process kit or the processing chamber of paragraph 13, wherein the electrically conductive material comprises aluminum or an aluminum alloy.

15. The process kit or the processing chamber according to any one of paragraphs 1-14, wherein the second ring component comprises silicon carbide.

16. The process kit or the processing chamber according to any one of paragraphs 1-15, wherein the first ring component comprises a stepped surface formed therein, and wherein the stepped surface of the first ring component interfaces with a portion of the lower surface of the second ring component.

17. The process kit or the processing chamber according to any one of paragraphs 1-16, wherein the adjustable tuning ring comprises three or more slots extending from the lower surface of the adjustable tuning ring towards the upper surface of the adjustable tuning ring, and wherein each slot contains a lift pin disposed therein.

18. The process kit or the processing chamber of paragraph 17, wherein the adjustable tuning ring comprises three slots disposed around the adjustable tuning ring separated from each other by an angle of about 110 degrees to about 130 degrees, as measured from the center of the adjustable tuning ring.

19. The process kit or the processing chamber of paragraph 17, wherein the adjustable tuning ring comprises four slots disposed around the adjustable tuning ring separated from each other by an angle of about 80 degrees to about 100 degrees, as measured from the center of the adjustable tuning ring.

20. The process kit or the processing chamber according to any one of paragraphs 1-19, wherein the actuating mechanism comprises two or more lift pins, each of the lift pins having a first end and a second end, the first end of the lift pin contacting the lower surface of the adjustable tuning ring, and the second end of the lift pin in communication with a lift mechanism.

21. The process kit or the processing chamber of paragraph 20, wherein the actuating mechanism comprises four lift pins, each of the first ends of the lift pins contacting a point on the lower surface of the adjustable tuning ring, the points on the lower surface are separated from each other by an angle of about 80 degrees to about 100 degrees, as measured from the center of the adjustable tuning ring.

22. The process kit or the processing chamber of paragraph 20, wherein the lift mechanism comprises a servo drive.

23. A method for processing a substrate, wherein the method is performed with the process kit or the processing chamber according to any one of paragraphs 1-22.

24. A method for processing a substrate, comprising: positioning the substrate on the substrate support member disposed in the process kit or the processing chamber according to any one of paragraphs 1-22; forming a plasma above the substrate; and adjusting a height of the second ring component of the edge ring by actuating the adjustable tuning ring interfaced with the component to change a direction of ions at an edge of the substrate.

25. The method of paragraphs 23 or 24, wherein a gap is disposed between the lower alignment coupling of the adjustable tuning ring and the upper alignment coupling of the second ring.

26. The method according to any one of paragraphs 23-25, further comprising actuating the adjustable tuning ring to adjust a size of the gap and vary a capacitive coupling between the adjustable tuning ring and the second ring component.

While the foregoing is directed to specific embodiments, other and further embodiments may be devised without departing from the basic scope thereof, and the scope thereof is determined by the claims that follow.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A process kit for a substrate processing chamber, comprising:
    an edge ring having a first ring component and a second ring component, the first ring component interfaced with the second ring component such that the second ring component is movable relative to the first ring component forming a gap therebetween, the second ring component having an upper surface and a lower surface, the lower surface of the second ring component comprising an upper alignment coupling;
    an adjustable tuning ring positioned beneath the edge ring, the adjustable tuning ring having an upper surface and a lower surface, the upper surface of the adjustable tuning ring comprising a lower alignment coupling, the upper surface of the adjustable tuning ring is configured to contact the lower surface of the second ring component, and the lower alignment coupling of the adjustable tuning ring is configured to mate with the upper alignment coupling of the second ring component to form an interface;
    a second gap disposed between the upper surface of the adjustable tuning ring and the lower surface of the second ring component and disposed between the lower alignment coupling of the adjustable tuning ring and the upper alignment coupling of the second ring component;
    a cover ring at least partially adjacent to and at least partially underneath a portion of the second ring component, and wherein the cover ring is completely positioned radially outward of the first ring component and the adjustable tuning ring; and
    an actuating mechanism interfaced with the lower surface of the adjustable tuning ring, the actuating mechanism configured to actuate the adjustable tuning ring such that the gap between the first ring component and the second ring component is varied.

2. The process kit of claim 1, wherein the upper alignment coupling is a male coupling and the lower alignment coupling is a female coupling, or the upper alignment coupling is the female coupling and the lower alignment coupling is the male coupling.

3. The process kit of claim 2, wherein the interface formed by the male coupling and the female coupling has a mating profile, and wherein the mating profile is selected from the group consisting of dovetail, spline, finned, triangular, rectangular, square, trapezoidal, arced, and rounded.

4. The process kit of claim 1, wherein the actuating mechanism is configured to actuate the adjustable tuning ring such that the second gap between the lower alignment coupling and the upper alignment coupling is varied.

5. The process kit of claim 1, further comprising an electrically insulating support ring disposed between the adjustable tuning ring and the actuating mechanism.

6. The process kit of claim 5, wherein the electrically insulating support ring comprises a polytetrafluoroethylene material.

7. The process kit of claim 5, wherein the actuating mechanism comprises a lift pin, and wherein the electrically insulating support ring is between and contacting the adjustable tuning ring and the lift pin.

8. The process kit of claim 7, wherein an alignment coupling on the lower surface of the adjustable tuning ring and an alignment coupling on an upper surface of the electrically insulating support ring mate to form a mating profile therebetween.

9. The process kit of claim 5, wherein the electrically insulating support ring mate comprises three or more slots extending from a lower surface of the electrically insulating support ring mate towards an upper surface of the electrically insulating support ring mate, and wherein each slot contains a lift pin disposed therein.

10. The process kit of claim 1, wherein the first ring component comprises a stepped surface formed therein, and wherein the stepped surface of the first ring component interfaces with a portion of the lower surface of the second ring component.

11. The process kit of claim 1, wherein the adjustable tuning ring comprises three or more slots extending from the lower surface of the adjustable tuning ring towards the upper surface of the adjustable tuning ring, wherein each slot contains a lift pin disposed therein, and wherein each lift pin is disposed between the adjustable tuning ring and the actuating mechanism.

12. The process kit of claim 11, wherein the adjustable tuning ring comprises three slots disposed around the adjustable tuning ring separated from each other by an angle of about 110 degrees to about 130 degrees, as measured from the center of the adjustable tuning ring.

13. The process kit of claim 11, wherein the adjustable tuning ring comprises four slots disposed around the adjustable tuning ring separated from each other by an angle of about 80 degrees to about 100 degrees, as measured from the center of the adjustable tuning ring.

14. The process kit of claim 1, wherein the actuating mechanism comprises two or more lift pins, each of the lift pins having a first end and a second end, the first end of the lift pin contacting the lower surface of the adjustable tuning ring, and the second end of the lift pin in communication with a lift mechanism.

15. The process kit of claim 14, wherein the actuating mechanism comprises four lift pins, each of the first ends of the lift pins contacting a point on the lower surface of the adjustable tuning ring, the points on the lower surface are separated from each other by an angle of about 80 degrees to about 100 degrees, as measured from the center of the adjustable tuning ring.

16. A processing chamber, comprising:
a substrate support member configured to support a substrate; and
a process kit supported by the substrate support member, the process kit comprising:
an edge ring having a first ring component and a second ring component, the first ring component interfaced with the second ring component such that the second ring component is movable relative to the first ring component forming a gap therebetween, the second ring component having an upper surface and a lower surface, the lower surface of the second ring component comprising an upper alignment coupling;
an adjustable tuning ring positioned beneath the edge ring, the adjustable tuning ring having an upper surface and a lower surface, the upper surface of the adjustable tuning ring comprising a lower alignment coupling, the upper surface of the adjustable tuning ring is configured to contact the lower surface of the second ring component, and the lower alignment coupling of the adjustable tuning ring is configured to mate with the upper alignment coupling of the second ring component to form an interface;
a second gap disposed between the upper surface of the adjustable tuning ring and the lower surface of the second ring component and disposed between the lower alignment coupling of the adjustable tuning ring and the upper alignment coupling of the second ring component;
a cover ring at least partially adjacent to and at least partially underneath a portion of the second ring component, and wherein the cover ring is completely positioned radially outward of the first ring component and the adjustable tuning ring; and
an actuating mechanism interfaced with the lower surface of the adjustable tuning ring, the actuating mechanism configured to actuate the adjustable tuning ring such that the gap between the first ring component and the second ring component is varied.

17. The processing chamber of claim 16, wherein the substrate support member comprises:
a base;
a cooling plate supported by the base; and
an electrostatic chuck positioned on an upper surface of the cooling plate.

18. A method for processing a substrate, comprising:
positioning the substrate on the substrate support member disposed in the processing chamber of claim 16;
forming a plasma above the substrate; and
adjusting a height of the second ring component of the edge ring by actuating the adjustable tuning ring interfaced with the component to change a direction of ions at an edge of the substrate.

19. The method of claim 18, wherein a second gap is disposed between the lower alignment coupling of the adjustable tuning ring and the upper alignment coupling of the second ring component, and wherein the method further comprises actuating the adjustable tuning ring to adjust a size of the second gap and vary a capacitive coupling between the adjustable tuning ring and the second ring component.

20. A process kit for a substrate processing chamber, comprising:
an edge ring having a first ring component and a second ring component, the first ring component interfaced with the second ring component such that the second ring component is movable relative to the first ring component forming a gap therebetween, the second ring component having an upper surface and a lower surface, the lower surface of the second ring component comprising an upper alignment coupling;

an adjustable tuning ring positioned beneath the edge ring, the adjustable tuning ring having an upper surface and a lower surface, the upper surface of the adjustable tuning ring comprising a lower alignment coupling, the upper surface of the adjustable tuning ring is configured to contact the lower surface of the second ring component, and wherein:
  the upper alignment coupling is a male coupling and the lower alignment coupling is a female coupling configured to mate with the male coupling, or
  the upper alignment coupling is the female coupling and the lower alignment coupling is the male coupling configured to mate with the female coupling;
a second gap disposed between the upper surface of the adjustable tuning ring and the lower surface of the second ring component and disposed between the lower alignment coupling of the adjustable tuning ring and the upper alignment coupling of the second ring component;
a cover ring at least partially adjacent to and at least partially underneath a portion of the second ring component, and wherein the cover ring is completely positioned radially outward of the first ring component and the adjustable tuning ring; and
an actuating mechanism interfaced with the lower surface of the adjustable tuning ring, the actuating mechanism configured to actuate the adjustable tuning ring such that the gap between the first ring component and the second ring component is varied.

* * * * *